US011569321B2

(12) United States Patent
Lee et al.

(10) Patent No.: US 11,569,321 B2
(45) Date of Patent: Jan. 31, 2023

(54) DISPLAY APPARATUS AND METHOD OF MANUFACTURING THE SAME

(71) Applicant: Samsung Display Co., Ltd., Yongin-Si (KR)

(72) Inventors: Wangwoo Lee, Yongin-si (KR); Minwoo Woo, Yongin-si (KR); Gunwoo Ko, Yongin-si (KR); Haeyoung Yun, Yongin-si (KR); Hyungjoo Jeon, Yongin-si (KR); Junghyun Cho, Yongin-si (KR)

(73) Assignee: Samsung Display Co., Ltd.

( * ) Notice: Subject to any disclaimer, the term of this patent is extended or adjusted under 35 U.S.C. 154(b) by 108 days.

(21) Appl. No.: 17/135,840

(22) Filed: Dec. 28, 2020

(65) Prior Publication Data

US 2022/0013607 A1    Jan. 13, 2022

(30) Foreign Application Priority Data

Jul. 8, 2020 (KR) .......................... 10-2020-0084342

(51) Int. Cl.
*H01L 27/32* (2006.01)

(52) U.S. Cl.
CPC ........ *H01L 27/3258* (2013.01); *H01L 27/322* (2013.01); *H01L 27/326* (2013.01)

(58) Field of Classification Search
CPC . H01L 27/3258; H01L 27/322; H01L 27/326; H01L 51/5281; H01L 51/5256; H01L 27/323; H01L 51/5237; H01L 27/3244; H01L 51/525; H01L 51/5262; H01L 51/5246; H01L 51/5284; H01L 51/56
See application file for complete search history.

(56) References Cited

U.S. PATENT DOCUMENTS

| | | | |
|---|---|---|---|
| 10,459,276 B2 | 10/2019 | Hong et al. | |
| 11,081,676 B2* | 8/2021 | Kim | ...................... G06F 3/0412 |
| 11,258,049 B2* | 2/2022 | Kim | ...................... H01L 27/323 |
| 2009/0273834 A1 | 11/2009 | Korenaga | |
| 2019/0013495 A1 | 1/2019 | Kim et al. | |
| 2019/0122597 A1 | 4/2019 | Lee et al. | |
| 2019/0165061 A1* | 5/2019 | Jung | ................... H01L 51/5209 |
| 2019/0198587 A1* | 6/2019 | Park | ................... H01L 51/5237 |
| 2020/0058729 A1 | 2/2020 | Jung et al. | |

(Continued)

FOREIGN PATENT DOCUMENTS

| | | |
|---|---|---|
| JP | 2006-047562 A | 2/2006 |
| JP | 4283339 B2 | 6/2009 |

(Continued)

*Primary Examiner* — Kevin Quarterman
(74) *Attorney, Agent, or Firm* — Innovation Counsel LLP

(57) ABSTRACT

A display apparatus includes a substrate including a display area and a peripheral area outside the display area, a display element arranged on the substrate in the display area, an encapsulation layer arranged on the display element, a first insulating layer arranged on the encapsulation layer and including a first opening that corresponds to a light-emitting area of the display element, and a second insulating layer covering the first insulating layer. A second refractive index of the second insulating layer is greater than a first refractive index of the first insulating layer, and a side surface of the first insulating layer defining the first opening includes a staircase-shaped step.

20 Claims, 23 Drawing Sheets

(56) References Cited

U.S. PATENT DOCUMENTS

| | | | | |
|---|---|---|---|---|
| 2020/0144550 A1* | 5/2020 | Lee | ................... | H01L 51/5281 |
| 2020/0243802 A1* | 7/2020 | Ju | ................... | H01L 27/3272 |
| 2020/0350516 A1 | 11/2020 | An et al. | | |
| 2021/0066410 A1* | 3/2021 | Jo | ................... | H01L 27/3234 |
| 2021/0066415 A1* | 3/2021 | Lee | ................... | H01L 51/5209 |

FOREIGN PATENT DOCUMENTS

| | | |
|---|---|---|
| KR | 10-2016-0098607 A | 8/2016 |
| KR | 10-2019-0004863 A | 1/2019 |
| KR | 10-2019-0043900 A | 4/2019 |
| KR | 10-2020-0021188 A | 2/2020 |

* cited by examiner

DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2020-0084342, filed on Jul. 8, 2020, in the Korean Intellectual Property Office, the disclosure of which is incorporated by reference herein in its entirety.

BACKGROUND

1. Field

The present disclosure relates to a display apparatus and a method of manufacturing the display apparatus.

2. Description of Related Art

The usage of display apparatuses has steadily been diversified and been expanded as the display apparatuses have become thinner and lighter, and demands for display apparatuses capable of providing high-resolution and high display quality have increased.

SUMMARY

The present disclosure provides a display apparatus that is capable of providing a high-quality image with an improved light efficiency. However, the scope of the present disclosure is not limited thereto.

Additional aspects of the present disclosure will be set forth in part in the description that follows and, in part, will be apparent from the description, or may be learned by practice of the embodiments of the present disclosure described herein.

According to one embodiment, a display apparatus includes a substrate including a display area and a peripheral area outside the display area, a display element arranged on the substrate in the display area, an encapsulation layer arranged on the display element, a first insulating layer arranged on the encapsulation layer and including a first opening that corresponds to a light-emitting area of the display element, and a second insulating layer covering the first insulating layer. A second refractive index of the second insulating layer is greater than a first refractive index of the first insulating layer, and a side surface of the first insulating layer defining the first opening includes a staircase-shaped step.

The first opening of the first insulating layer may overlap the light-emitting area of the display element. The second insulating layer may fill the first opening.

The display apparatus may further include a conductive layer arranged below the first insulating layer and including sensing electrodes.

The conductive layer may include a first sub-conductive layer and a second sub-conductive layer, and a touch insulating layer is arranged between the first sub-conductive layer and the second sub-conductive layer.

The display element may include a pixel electrode, a pixel defining layer covering an edge of the pixel electrode and including a second opening that exposes the pixel electrode, an emission layer arranged in the second opening of the pixel defining layer, and an opposite electrode covering the emission layer. The first insulating layer may at least partially overlap the pixel defining layer.

A first width of the first opening may be greater than a second width of the second opening.

The display apparatus may further include a first pixel and a second pixel emitting light of different colors. The first insulating layer comprises a first-first opening corresponding to the first pixel and a first-second opening corresponding to the second pixel, and a first side surface of the first-first opening comprise a step, and a second side surface of the first-second opening does not comprise a step.

A first light-emitting area of the first pixel may be greater than a second light-emitting area of the second pixel.

The first insulating layer may extend to the peripheral area. The display apparatus may further include a protruding dam that protrudes from the first insulating layer in the peripheral area.

The display apparatus may further include an anti-reflection layer including a color filter and a black matrix, wherein the color filter may overlap the light-emitting area, and the black matrix may overlap a non-light-emitting area outside the light-emitting area.

According to another embodiment, a display apparatus includes a substrate including a display area and a peripheral area outside the display area, a display element arranged on the substrate in the display area, an encapsulation layer arranged on the display element, a first insulating layer arranged on the encapsulation layer and including a first opening that corresponds to a light-emitting area of the display element, and a second insulating layer covering the first insulating layer. A second refractive index of the second insulating layer is greater than a first refractive index of the first insulating layer, and the display apparatus further includes a protruding dam that protrudes from the first insulating layer in the peripheral area.

The protruding dam may be provided integrally with the first insulating layer.

The display apparatus may further include a partition wall adjacent to the display area in the peripheral area, wherein the encapsulation layer may include a first inorganic encapsulation layer, an organic encapsulation layer, and a second inorganic encapsulation layer that are sequentially stacked, and the first inorganic encapsulation layer and the second inorganic encapsulation layer may contact each other at one side of the partition wall.

The display apparatus may further include an upper dam that is spaced apart from the protruding dam and arranged outside of the protruding dam, wherein a valley portion provided by removing at least a portion of the first insulating layer may be arranged between the protruding dam and the upper dam.

A first thickness of the upper dam may be substantially same as a second thickness of the protruding dam.

The protruding dam may be provided in plural, wherein a plurality of protruding dams may be spaced apart from each other.

The protruding dam may be arranged along an outer periphery of the display area.

The protruding dam may include a plurality of openings or grooves.

The display apparatus may further include a first valley portion between the display area and the protruding dam that is arranged in the peripheral area, and a second valley portion between the protruding dam and an end of the substrate, wherein a plurality of first holes penetrating through the first insulating layer may be arranged in the first valley portion, and the second valley portion may correspond to an opening formed by removing the first insulating layer along a periphery of the display area.

A side surface of the first insulating layer defining the first opening may include a staircase-shaped step.

According to another embodiment, a method of manufacturing a display apparatus includes forming a display element in a display area of a substrate, wherein the substrate comprises the display area and a peripheral area outside the display area, forming an encapsulation layer that covers the display element, forming a first insulating layer on the encapsulation layer, wherein the first insulating layer includes a first opening corresponding to a light-emitting area of the display element, and forming a second insulating layer covering the first insulating layer. A second refractive index of the is second insulating layer is greater than a first refractive index of the first insulating layer.

A side surface of the first insulating layer defining the first opening may include a staircase-shaped step. The first insulating layer may extend to the peripheral area, and a maximum thickness of the first insulating layer in the display area may be greater than a thickness of the first insulating layer in the peripheral area.

The first insulating layer may extend to the peripheral area. The method may further include forming a protruding dam that protrudes from the first insulating layer at an end of the first insulating layer. The protruding dam may be integrally formed with the first insulating layer.

A first maximum thickness of the first insulating layer in the peripheral area may be greater than a second maximum thickness of the first insulating layer in the display area.

A side surface of the first insulating layer defining the first opening may include a staircase-shaped step, and the first insulating layer may extend to the peripheral area. The method may further include forming a protruding dam that protrudes from the first insulating layer at an end of the first insulating layer. The staircase-shaped step and the protruding dam may be formed simultaneously.

A first maximum thickness of the first insulating layer in the peripheral area may be substantially same as a second maximum thickness of the first insulating layer in the display area.

The first opening of the first insulating layer may overlap the light-emitting area of the display element, and the second insulating layer may fill the first opening.

The method may further include forming a conductive layer below the first insulating layer. The conductive layer may include sensing electrodes.

The method may further include forming an anti-reflection layer including a color filter and a black matrix, wherein the color filter may overlap the light-emitting area, and the black matrix may overlap a non-light-emitting area outside the light-emitting area.

The anti-reflection layer may be arranged between the first insulating layer and the conductive layer.

BRIEF DESCRIPTION OF THE DRAWINGS

The above and other aspects, features, and advantages of embodiments of the present disclosure will be more apparent from the following description taken in conjunction with the accompanying drawings, in which.

DETAILED DESCRIPTION

Figure 1:
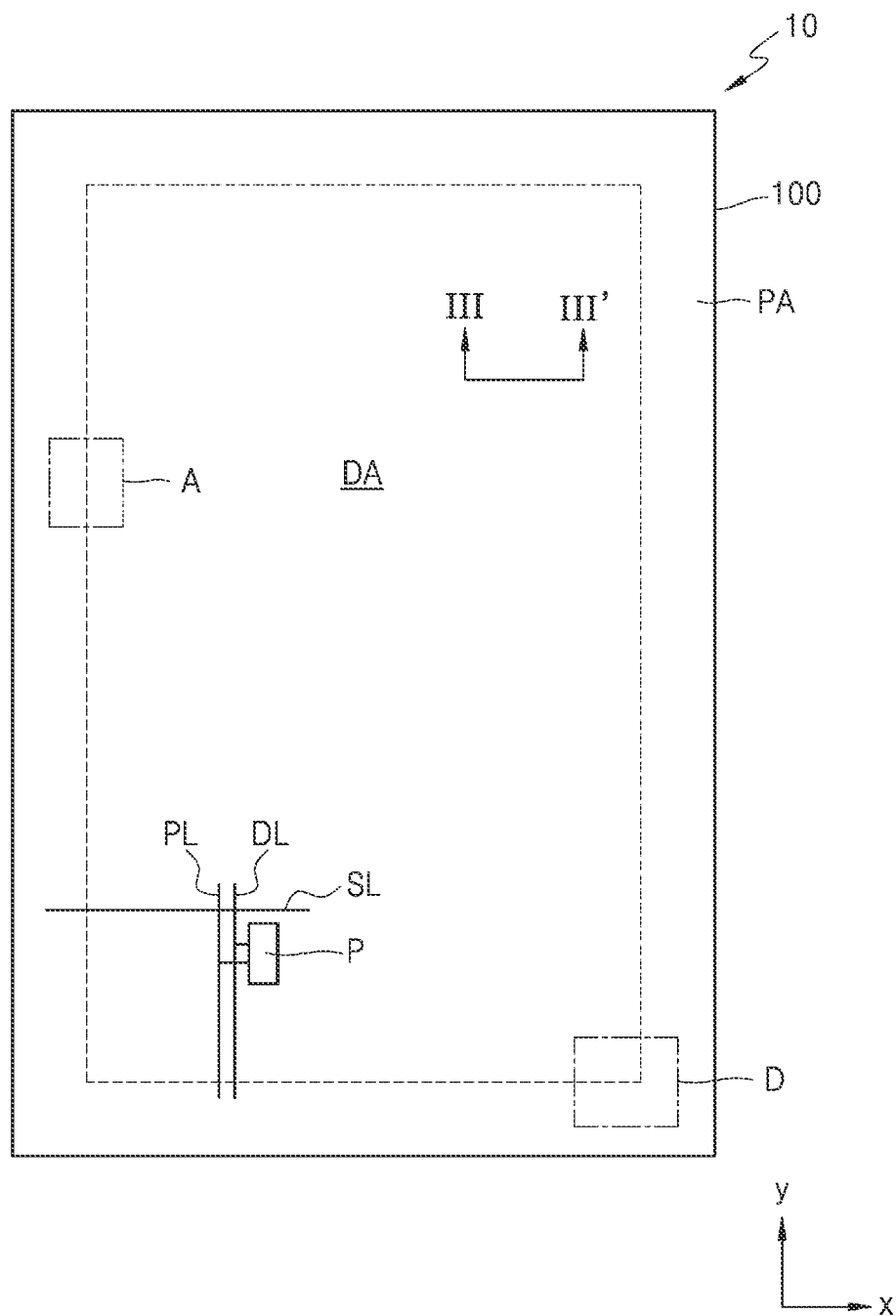
FIG. 1 is a plan view schematically illustrating a display apparatus, according to an embodiment.

Reference will now be made in detail to embodiments, examples of which are illustrated in the accompanying drawings, wherein like reference numerals refer to like elements throughout the present disclosure. In this regard, the present embodiments may have different forms and configuration and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

Because the present disclosure may have diverse modified embodiments, embodiments are illustrated in the drawings and are described with respect to the embodiments. An effect and a characteristic of the present disclosure, and a method of accomplishing them will be apparent by referring to embodiments described with reference to the drawings. The present disclosure may, however, be embodied in many different forms and configurations and should not be construed as limited to the embodiments set forth herein.

One or more embodiments of the present disclosure will be described below in more detail with reference to the accompanying drawings. Components that are the same or are in correspondence with each other are rendered the same reference numeral regardless of the figure number, and redundant explanations are omitted.

While such terms as "first," "second," etc., may be used to describe various components, such components are not to be limited to the above terms. The above terms are used only to distinguish one component from another component.

An expression used in the singular encompasses an expression of the plural unless the context expressly indicates otherwise.

It will be understood that the terms "comprises" and/or "comprising" used herein specify the presence of stated features or elements, but do not preclude the presence or addition of one or more other features or elements.

It will be further understood that when a layer, region, or element is referred to as being "formed on" another layer, area, or element, it can be directly or indirectly formed on the other layer, region, or element. That is, for example, one or more intervening layers, regions, or elements may be present therebetween.

Sizes of elements in the drawings may be exaggerated for convenience of explanation. In other words, because sizes and thicknesses of components in the drawings are arbitrarily illustrated for convenience of explanation, the following embodiments are not limited thereto.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected, and an intervening layer, region, component, or the like may be present therebetween.

In the following examples, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

In the present disclosure, the term "and/or" includes any and all combinations of one or more of the associated listed items. For example, "A and/or B" may include "A," "B," or "A and B."

FIG. 1 is a plan view schematically illustrating a display apparatus 10, according to an embodiment.

Referring to FIG. 1, the display apparatus 10 includes a substrate 100 that is divided into a display area DA and a peripheral area PA around the display area DA. The display apparatus 10 may display an image using light emitted by a plurality of pixels P arranged in the display area DA.

Each pixel P includes a display element such as an organic light-emitting diode or an inorganic light-emitting diode, and may emit a light, for example, red, green, blue, or white light. That is, each pixel P may be connected to a pixel circuit including a thin-film transistor (TFT), a storage capacitor, or the like. The pixel circuit may be connected to a scan line SL, a data line DL crossing the scan line SL, and a driving voltage line PL.

Each pixel P may emit light by driving of the pixel circuit, and the display area DA provides an image through the light emitted by the plurality of pixels P. In the present specification, a pixel P, as described above, may correspond to a light-emitting area that emits light of a color, for example, red, green, blue, or white color.

The peripheral area PA may correspond to an area in which the pixels P are not arranged, and no image is provided. In the peripheral area PA, a driving circuit for driving the pixels P, a power supply line, and a terminal to which a printed circuit board including the driving circuit or a driver integrated circuit (IC) is connected may be arranged.

According to an embodiment, the display apparatus 10 may include an organic light-emitting display, an inorganic light-emitting display, a quantum dot display, and the like. An organic light-emitting display is described below as an example of the display apparatus 10 according to an embodiment. However, the display apparatus 10 is not limited thereto, and the features, which will be described below, may be applied to various types of display apparatuses without deviating from the scope of the present disclosure.

Figure 2:
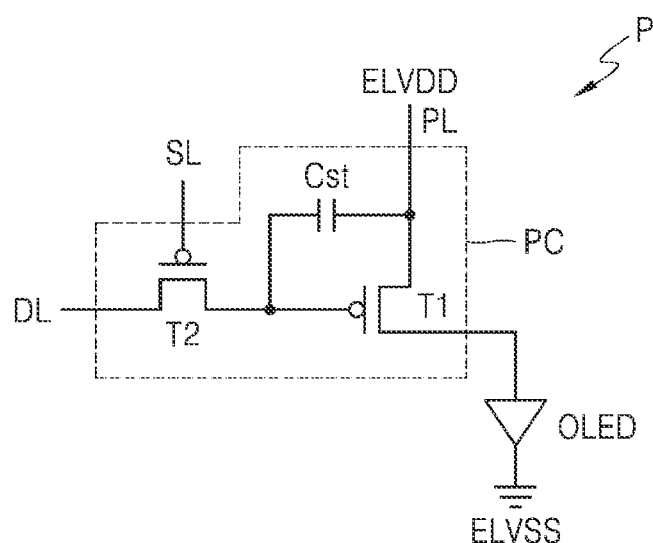
FIG. 2 shows a pixel of a display apparatus including a display element provided and a pixel circuit connected to the display element, according to an embodiment.

FIG. 2 shows a pixel P of the display apparatus 10 including a display element provided and a pixel circuit connected to the display element, according to an embodiment.

Referring to FIG. 2, the pixel P includes an organic light-emitting diode OLED as an example of the display element and a pixel circuit PC connected to the OLED. The pixel circuit PC may include a first TFT T1, a second TFT T2, and a storage capacitor Cst. For example, the organic light-emitting diode OLED may emit one of red, green, and blue light, or one of red, green, blue, and white light.

The second TFT T2 herein also referred to as a switching TFT is connected to the scan line SL and the data line DL and may transfer, according to a switching voltage received via the scan line SL and a data voltage received via the data line DL to the first TFT T1. The storage capacitor Cst is connected to the second TFT T2, and the driving voltage line PL and may store a voltage corresponding to a voltage difference between the data voltage received via the second TFT T2 and a first power voltage ELVDD applied to the driving voltage line PL.

The first TFT T1 herein also referred to as a driving TFT is connected to the driving voltage line PL and the storage capacitor Cst and may control a driving current flowing from the driving voltage line PL to the organic light-emitting diode OLED corresponding to a voltage stored in the storage capacitor Cst. The organic light-emitting diode OLED may emit light having a luminance according to the driving current. An electrode (e.g., a cathode) of the organic light-emitting diode OLED opposite to the electrode (e.g., an anode) connected to the first TFT T1 may receive a second power voltage ELVSS.

In FIG. 2, the pixel circuit PC shows an embodiment in which the pixel P includes two TFTs and one storage capacitor, but in another embodiment, the number of TFTs and/or the number of storage capacitors may vary according to the design of the pixel circuit PC without deviating from the scope of the present disclosure.

Figure 3A:
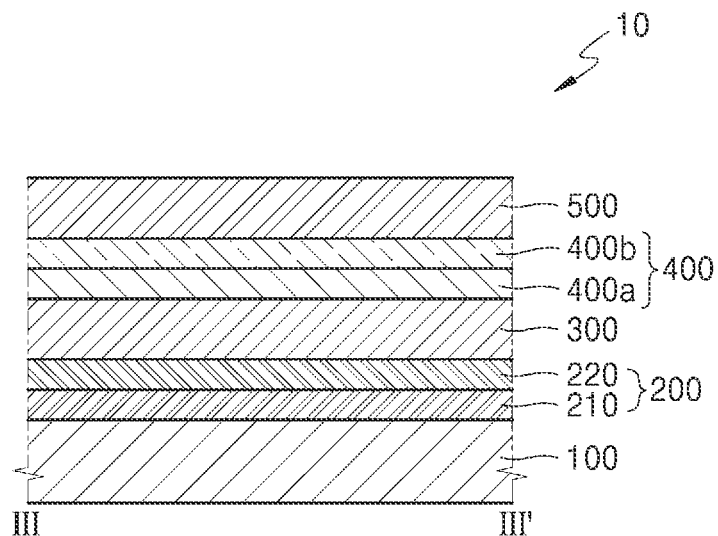
FIGS. 3A and 3B are cross-sectional views schematically illustrating a display apparatus, according to one or more embodiments.
Figure 3B:
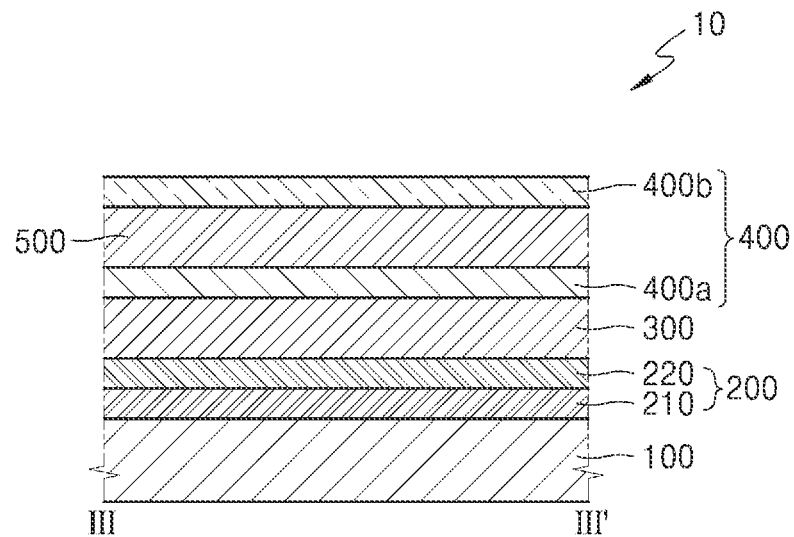

FIGS. 3A and 3B are cross-sectional views schematically illustrating the display apparatus 10 according to one or more embodiments, taken along line III-III' of the display apparatus 10 in FIG. 1.

Referring to FIG. 3A, the display apparatus 10 may include the substrate 100, a display layer 200, an encapsulation layer 300, a functional layer 400, and an anti-reflection layer 500.

The substrate 100 may include a polymer resin or a glass material. The substrate 100 including the polymer resin may be flexible, rollable, and/or bendable. The display layer 200 may include a display element layer 220 and a pixel circuit layer 210. The display element layer 220 may include a plurality of display elements, and the pixel circuit layer 210 may include pixel circuits respectively connected to the display elements. Each of the display elements in the display element layer 220 may define the pixel P, and the pixel circuit layer 210 may include a plurality of transistors and storage capacitors of the plurality of pixels P.

The encapsulation layer 300 may be arranged on the display layer 200. The encapsulation layer 300 may prevent the display elements from being damaged by foreign substances such as moisture. The encapsulation layer 300 may include at least one inorganic encapsulation layer and at least one organic encapsulation layer.

The functional layer 400 may be arranged on the encapsulation layer 300. The functional layer 400 may include a touch-sensing layer 400a and/or an optical layer 400b. The touch-sensing layer 400a may sense a user's touch input using at least one of various touch-sensing methods such as a resistive film method and a capacitive method. The optical layer 400b may improve a light emission efficiency of light emitted by the display elements. In one embodiment, the optical layer 400b may include two or more layers having different refractive indices.

In some embodiments, the functional layer 400 may have some components that are shared in the touch-sensing layer 400a and the optical layer 400b. For example, the functional layer 400 may include sensing electrodes to sense a touch input, and two or more layers having different refractive indices to improve optical performance. In some embodiments, the optical layer 400b may be integrated into the touch-sensing layer 400a or omitted.

The anti-reflection layer 500 may be arranged on the functional layer 400. The anti-reflection layer 500 may reduce the reflectance of light (external light) incident from the outside onto the display apparatus 10.

In some embodiments, the anti-reflection layer 500 may include a polarization film. The polarization film may include a linear planarization plate and a phase delay film such as a quarter-wave (λ/4) plate. The phase delay film may be arranged on the functional layer 400, and the linear polarization plate may be arranged on the phase delay film.

In some embodiments, the anti-reflection layer 500 may include a filter layer including a black matrix and color filters. The color filters may be arranged based on the color of light emitted by each of the pixels P of the display apparatus 10. For example, the filter layer may include a color filter of a red, green, or blue color.

In a case where the anti-reflection layer 500 includes a black matrix and color filters, the anti-reflection layer 500 may be arranged between the touch-sensing layer 400a and the optical layer 400b, as shown in FIG. 3B. A cover window (not shown) may be arranged on the anti-reflection layer 500 in FIG. 3A or on the optical layer 400b in FIG. 3B. The cover window may be attached onto the anti-reflection layer 500 with a transparent adhesive member such as an optically transparent adhesive film.

Figure 4:
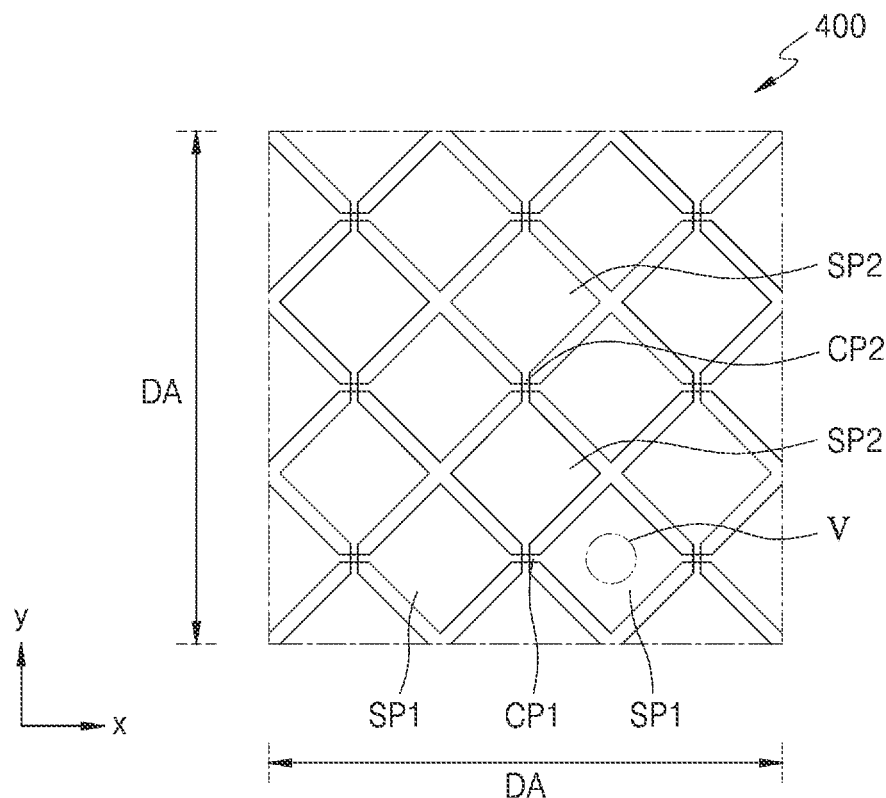
FIG. 4 is a plan view of a functional layer according to an embodiment.
Figure 5:
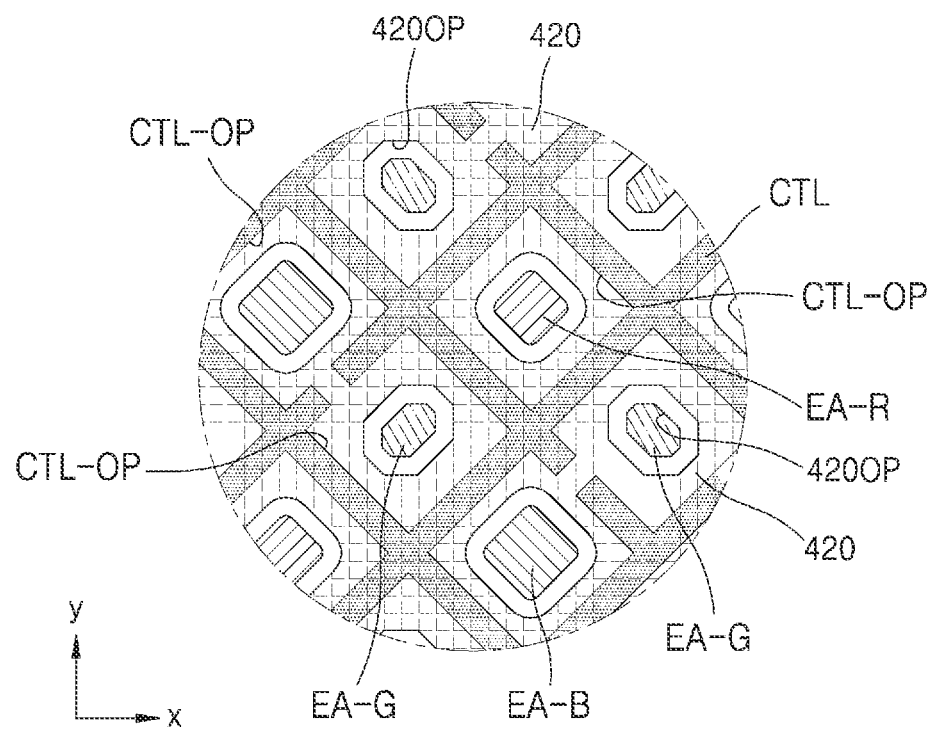
FIG. 5 is an enlarged plan view of a region of the functional layer in FIG. 4.

FIG. 4 is a plan view of the functional layer 400 of the display apparatus 10 according to an embodiment. FIG. 5 is an enlarged plan view of a region V of the functional layer 400 in FIG. 4.

Referring to FIG. 4, the functional layer 400 includes a plurality of first sensing electrodes SP1 arranged in a first direction (e.g., x direction), and a plurality of second sensing electrodes SP2 arranged in a second direction (e.g., y direction) crossing the first direction. The first direction and the second direction may intersect with each other. The first sensing electrodes SP1 that are adjacent to each other may be electrically connected through a first connection electrode CP1, and the second sensing electrodes SP2 that are adjacent to each other may be electrically connected through a second connection electrode CP2.

Each of the first sensing electrodes SP1 and the second sensing electrodes SP2 may include a conductive layer CTL, and the conductive layer CTL may include a metal layer or a transparent conductive layer. The metal layer may include molybdenum (Mo), silver (Ag), titanium (Ti), copper (Cu), aluminum (Al), and any alloys thereof. The transparent conductive layer may include a transparent conductive oxide such as indium tin oxide (ITO), indium zinc oxide (IZO), zinc oxide (ZnO), indium tin zinc oxide (ITZO), or the like. In addition, the transparent conductive layer may include a conductive polymer such as poly(3,4-ethylenedioxythiophene) (PEDOT), metal nanowires, carbon nanotubes, graphene, or the like. In some embodiments, each of the first connection electrodes CP1 and the second connection electrode CP2s may include the metal layer and/or the conductive layer CTL such as a transparent conductive layer.

The functional layer 400 including the first and second sensing electrodes SP1 and SP2 and the first and second connection electrodes CP1 and CP2 may have a mesh structure including a plurality of openings CTL-OP. For example, the first sensing electrodes SP1 may be formed on the conductive layer CTL as shown in FIG. 5. The conductive layer CTL includes the plurality of openings CTL-OP and body portions, wherein the body portions at least partially surround the openings CTL-OP, respectively, and the mesh structure may be formed by connecting the body portions to each other. Similarly, the respective second sensing electrodes SP2, the respective first connection electrodes CP1, and the respective second connection electrodes CP2 may have a mesh structure.

Each of the openings CTL-OP of the conductive layer CTL may overlap a light-emitting area EA (shown in FIG. 6) of a corresponding pixel P. For example, each of the openings CTL-OP may overlap a first light-emitting area that emits red light (EA-R), a second light-emitting area that emits green light (EA-G), or a third light-emitting area that emits blue light (EA-B).

At least one of the plurality of openings CTL-OP may be partially surrounded by a body portion of the conductive layer CTL, and in this case, the openings CTL-OP that are adjacent to each other may be spatially connected to each other as shown in FIG. 5. Unlike the example shown in FIG. 5, at least one of the plurality of openings CTL-OP may not be spatially connected to each other, and it may be entirely surrounded by the body portion of the conductive layer CTL.

The functional layer 400 may include a first insulating layer 420 arranged on the conductive layer CTL, and as shown in FIG. 5, the first insulating layer 420 may overlap the conductive layer CTL. The first insulating layer 420 includes first openings 420OP each corresponding to a light-emitting area EA. The first openings 420OP of the first insulating layer 420 may be formed by removing portions of the first insulating layer 420 through exposure and development processes. The first openings 420OP may be formed through the upper and lower surfaces of the first insulating layer 420. In a plan view, each of the first openings 420OP may have a shape corresponding to a shape of the light-emitting area EA. For example, the red and blue light-emitting areas EA-R and EA-B and their corresponding first openings 420OP may have similar shapes, for example, a rectangular shape, and the green light-emitting area EA-G and its corresponding first openings 420OP may have similar shapes, for example, a hexagonal or octagonal shape. In the present disclosure, "A corresponds to B" may refer to "A overlaps B." In another embodiment, each of the first openings 420OP may have a shape that is different from a shape of the corresponding light-emitting area EA. For example, the red, blue, and green light-emitting areas EA-R, EA-B, and EA-G may have a polygonal shape, and each of the first openings 420OP corresponding there to may have a circular shape.

Figure 6:
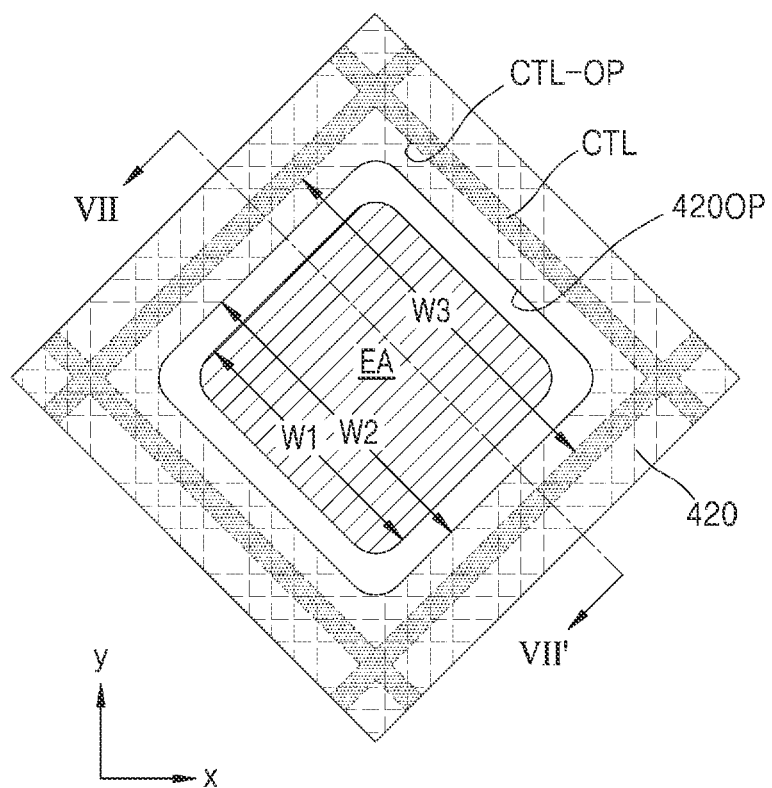
FIG. 6 is a plan view illustrating a pixel of a display apparatus, according to an embodiment.
Figure 7:
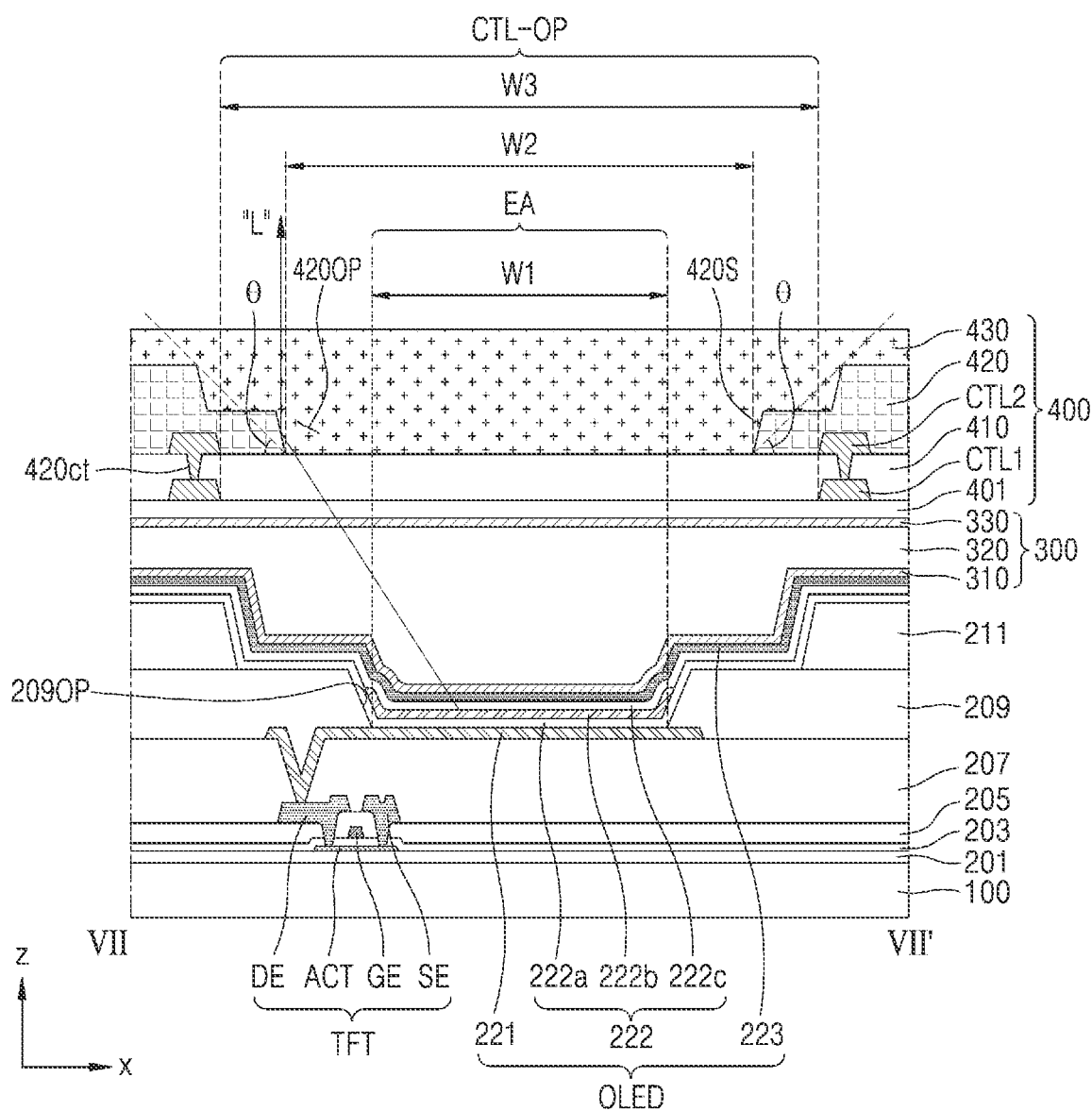
FIG. 7 is a cross-sectional view of the pixel of the display apparatus taken along line VII-VII' in FIG. 6 according to an embodiment.

FIG. 6 is a plan view illustrating a pixel P of the display apparatus 10 according to an embodiment, and FIG. 7 is a cross-sectional view of the pixel P of the display apparatus 10 taken along line VII-VII' in FIG. 6 according to an embodiment.

Referring to FIGS. 6 and 7, the opening CTL-OP of the conductive layer CTL, the first opening 420OP of the first insulating layer 420, and the light-emitting area EA overlap each other. A size of the opening CTL-OP of the conductive layer CTL may be greater than a size of the first opening 420OP of the first insulating layer 420, and the size of the first opening 420OP of the first insulating layer 420 may be greater than a size of the light-emitting area EA. For example, a first width W1 of the light-emitting area EA in the x direction is less than a second width W2 of the first opening 420OP of the first insulating layer 420 in the x direction, and the second width W2 of the first opening 420OP of the first insulating layer 420 in the x direction is less than a third width W3 of the opening CTL-OP of the conductive layer CTL in the x direction.

The body portion of the conductive layer CTL may overlap the first insulating layer 420, for example, the body portion of the first insulating layer 420. The conductive layer CTL may include a plurality of sub-layers, and FIG. 7 shows as an example in which the conductive layer CTL includes a first sub-conductive layer CTL1 and a second sub-conductive layer CTL2.

The first sub-conductive layer CTL1 and the second sub-conductive layer CTL2 may be arranged with a touch insulating layer 410 interposed therebetween, and a touch buffer layer 401 may be arranged below the first sub-conductive layer CTL1 and the second sub-conductive layer CTL2. The substrate 100, the display layer 200 including the organic light-emitting diode OLED, and the encapsulation layer 300 may be arranged below the touch buffer layer 401.

Referring to FIG. 7, the substrate 100 may be a single layer including glass material. Alternatively, the substrate 100 may include a polymer resin. The substrate 100 including a polymer resin may have a stacked structure including an inorganic layer stacked on the polymer resin. In an embodiment, the polymer resin included in the substrate 100 may be polyethersulfone, polyarylate, polyetherimide, polyethylene naphthalate, polyethylene terephthalate, polyphenylene sulfide, polyimide, polycarbonate, cellulose triacetate, and/or cellulose acetate propionate, and the substrate 100 may be flexible. The substrate 100 may include glass including silicon oxide ($SiO_2$) or may include a resin such as reinforced plastic and may be rigid.

A TFT may include a semiconductor layer ACT including amorphous silicon, polycrystalline silicon, or an organic semiconductor material, a gate electrode GE, a source electrode SE, and a drain electrode DE. A gate insulating layer 203 may be arranged between the semiconductor layer ACT and the gate electrode GE, and may include an inorganic material such as silicon oxide, silicon nitride, and/or silicon oxynitride. In addition, an interlayer insulating layer 205 may be arranged on the upper portion of the gate electrode GE, and the source electrode SE and the drain electrode DE may be arranged on the interlayer insulating layer 205. The interlayer insulating layer 205 may include an inorganic material such as silicon oxide, silicon nitride, and/or silicon oxynitride. The gate insulating layer 203 or the interlayer insulating layer 205 including an inorganic material may be formed through chemical vapor deposition (CVD) or atomic layer deposition (ALD).

The gate electrode GE, the source electrode SE, and the drain electrode DE may be formed of various conductive materials. For example, the gate electrode GE may include Mo and/or Al and may have a multi-layer structure. For example, the gate electrode GE may have a single Mo layer or may have a three-layer structure including a Mo layer, an Al layer, and another Mo layer. The source electrode SE and the drain electrode DE may include Ti and/or Al, and may have a multi-layer structure. For example, the source electrode SE and the drain electrode DE may have a three-layer structure including a Ti layer, an Al layer, and another Ti layer.

A buffer layer 201 may be arranged between the TFT and the substrate 100. The buffer layer 201 may include an inorganic material such as silicon oxide, silicon nitride, and/or silicon oxynitride. The buffer layer 201 may increase the smoothness of the upper surface of the substrate 100 or may prevent or significantly reduce impurities from the substrate 100 or the like from penetrating into the semiconductor layer ACT of the TFT.

A planarization insulating layer 207 may be arranged on the TFT. The planarization insulating layer 207 may be formed of an organic material such as acryl, benzocyclobutene (BCB), or hexamethyldisiloxane (HMDSO). The planarization insulating layer 207 may include a single layer or multiple layers.

A pixel electrode 221 may be arranged on the planarization insulating layer 207. The pixel electrode 221 is arranged for each pixel. The pixel electrodes 221 respectively corresponding to the pixels that are adjacent to each other may be spaced apart from each other.

The pixel electrode 221 may be a reflective electrode. In some embodiments, the pixel electrode 221 may include a reflective layer formed of Ag, magnesium (Mg), Al, platinum (Pt), palladium (Pd), gold (Au), nickel (Ni), neodymium (Nd), iridium (Ir), chromium (Cr), and compounds thereof, and a transparent or translucent electrode layer on the reflective layer. The transparent or translucent electrode layer may include at least one selected from the group consisting of ITO, IZO, ZnO, indium oxide ($In_2O_3$), indium gallium oxide (IGO), and aluminum zinc oxide (AZO). In some embodiments, the pixel electrode 221 may have a three-layer structure of an ITO layer, an Ag layer, and another ITO layer.

A pixel defining layer 209 may be arranged on the pixel electrode 221. The pixel defining layer 209 has a second opening 209OP that exposes the central portion of the pixel electrode 221. The pixel defining layer 209 may cover edges of the pixel electrode 221 and increase a distance or gap between the edges of the pixel electrode 221 and an opposite electrode 223 to prevent an arc or the like at the edges of the pixel electrode 221. The pixel defining layer 209 may include an organic insulating material such as polyimide, polyamide, an acrylic resin, BCB, HMDSO, and a phenol resin, and may be formed by a method such as spin coating. Alternatively, the pixel defining layer 209 may include an inorganic insulating material. Alternatively, the pixel defining layer 209 may have a multi-layer structure including at least one inorganic insulating material and at least one organic insulating material.

A spacer 211 may be arranged on the pixel defining layer 209. The spacer 211 may prevent damages of the layers arranged between the substrate 100 and the spacer 211 by a mask in a process of forming an emission layer 222b, which will be described below. The spacer 211 may include the same material as a material included in the pixel defining layer 209.

The emission layer 222b may be arranged in the second opening 209OP of the pixel defining layer 209. The emission layer 222b may include an organic material such as a fluorescent or phosphorescent material emitting red, green, or blue light. The organic material may have a low molecular weight or a high molecular weight.

A first common layer 222a and a second common layer 222c may be arranged with the emission layer 222b interposed therebetween. The first common layer 222a may include, for example, a hole transport layer (HTL) and/or a hole injection layer (HIL). The second common layer 222c may include an electron transport layer (ETL) and/or an electron injection layer (EIL). The second common layer 222c may be optional. In some embodiments, the second common layer 222c may be omitted.

The emission layer 222b may be arranged for each pixel P to correspond to the second opening 209OP of the pixel definition layer 209, whereas the first common layer 222a and the second common layer 222c may be, like the opposite electrode 223 to be described below, common electrodes that are integrally formed to entirely cover the substrate 100, for example, the display area DA of the substrate 100.

The opposite electrode 223 may include a (semi)transparent layer including Ag, Mg, Al, Pt, Pd, Au, Ni, Nd, Ir, Cr, Li, calcium (Ca), or any alloys thereof. Alternatively, the opposite electrode 223 may further include a layer formed of, for example, ITO, IZO, ZnO, or $In_2O_3$ on the (semi) transparent layer including the above-mentioned materials. In an embodiment, the opposite electrode 223 may include Ag, Mg, or an alloy of Ag and Mg.

The encapsulation layer 300 may include at least one inorganic encapsulation layer and at least one organic encapsulation layer. For example, the encapsulation layer 300 may include a first inorganic encapsulation layer 310, an organic encapsulation layer 320, and a second inorganic encapsulation layer 330 as shown in FIG. 7.

The first inorganic encapsulation layer 310 and the second inorganic encapsulation layer 330 may include at least one inorganic insulating material selected from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may have a single-layer or a multi-layer structure including one or more of the aforementioned inorganic insulating materials.

The organic encapsulation layer 320 may relieve internal stress of the first inorganic encapsulation layer 310 and/or the second inorganic encapsulation layer 330. The organic encapsulation layer 320 may include a polymer-based material. The polymer-based material may include polyethylene terephthalate, polyethylene naphthalate, polycarbonate, polyimide, polyethylene sulfonate, polyoxymethylene, polyarylate, HMDSO, an acrylic resin (e.g., polymethylmethacrylate, polyacrylic acid, etc.), or any combination thereof.

The organic encapsulation layer 320 may be formed by applying a flowable monomer and curing the monomer layer by heat or light such as ultraviolet rays. Alternatively, the organic encapsulation layer 320 may be formed by applying at least one of the above-described polymer-based materials.

The functional layer 400 may be arranged on the encapsulation layer 300. The functional layer 400 may include the first and second sub-conductive layers CTL1 and CTL2, the touch insulating layer 410, the first insulating layer 420, and a second insulating layer 430. In addition, the functional layer 400 may further include the touch buffer layer 401.

The touch buffer layer 401 may be directly arranged on the encapsulation layer 300. The touch buffer layer 401 may prevent the encapsulation layer 300 from being damaged, and may block interference signals that may occur when the touch-sensing layer 400a of the functional layer 400 shown in FIGS. 3A and 3B is driven. The touch buffer layer 401 includes an inorganic insulating material such as silicon oxide ($SiO_x$), silicon nitride ($SiN_x$), silicon oxynitride ($SiO_xN_y$), or the like, and may include a single layer or multiple layers.

The first sub-conductive layer CTL1 and the second sub-conductive layer CTL2 may be arranged with the touch insulating layer 410 interposed therebetween. The first sub-conductive layer CTL1 may be connected to the second sub-conductive layer CTL2 through a contact hole 420ct formed in the touch insulating layer 410. The first sensing electrode SP1 and the second sensing electrode SP2 that are described above with reference to FIG. 5 may have a two-layer structure including the first sub-conductive layer CTL1 and the second sub-conductive layer CTL2 that are connected through the contact hole 410ct, as shown in FIG. 7.

The touch insulating layer 410 may include an inorganic material and/or an organic material. The inorganic material may be at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may be at least one of an acrylic resin, a methacrylic resin, a polyisoprene, a vinyl resin, an epoxy resin, a urethane resin, a cellulose resin, and a perylene resin.

Each of the first sub-conductive layer CTL1 and the second sub-conductive layer CTL2 may include a metal layer and/or a transparent conductive layer. The metal layer may include Mo, Ag, Ti, Cu, Al, and any alloys thereof. The transparent conductive layer may include a transparent conductive oxide such as ITO, IZO, ZnO, ITZO, and the like. In addition, the transparent conductive layer may include a conductive polymer such as PEDOT, metal nanowires, carbon nanotubes, graphene, and the like. In an embodiment, each of the first sub-conductive layer CTL1 and the second sub-conductive layer CTL2 may have a three-layer structure including a Ti layer, an Al layer, and another Ti layer.

The first insulating layer 420 may be arranged on the second sub-conductive layer CTL2. The first insulating layer 420 may include the first opening 420OP that overlaps the light-emitting area EA. The light-emitting area EA may correspond to the second opening 209OP of the pixel defining layer 209. For example, a width of the second opening 209OP of the pixel defining layer 209 may correspond to the first width W1 of the light-emitting area EA. The first opening 420OP of the first insulating layer 420 may overlap the second opening 209OP of the pixel defining layer 209, but the second width W2 of the first opening 420OP of the first insulating layer 420 may be greater than the first width W1 of the second opening 209OP of the pixel defining layer 209. The body portion of the first insulating layer 420 defining the first opening 420OP of the first insulating layer 420 may overlap the body portion of the pixel defining layer 209. The body portion of the first insulating layer 420 may be distinct from the first opening 420OP of the first insulating layer 420, and may correspond to a portion having a volume. Likewise, the body portion of the pixel defining layer 209 may be distinct from the second opening 209OP of the pixel defining layer 209, and may correspond to a portion having a volume.

The first insulating layer 420 may include a photoresist. The first insulating layer 420 may be formed by applying a photoresist on the encapsulation layer 300 and exposing and developing the encapsulation layer 300 on which the photoresist is applied. The first insulating layer 420 may cover the conductive layer CTL included in the functional layer 400, for example, the first and second sub-conductive layers CTL1 and CTL2, and protects the conductive layer CTL.

The second insulating layer 430 may be arranged on the first insulating layer 420 and may fill the first opening 420OP of the first insulating layer 420. For example, the second insulating layer 430 may fill the first opening 420OP of the first insulating layer 420. The second insulating layer 430 may have a flat upper surface, a first thickness at a portion overlapping the first opening 420OP of the first insulating layer 420, and a second thickness at other portions, for example, portions overlapping the upper surface of the first insulating layer 420. The first thickness of the second insulating layer 430 may be greater than the second thickness.

The second insulating layer 430 may be in direct contact with a side surface 420S and the upper surface of the first insulating layer 420. In addition, the second insulating layer 430 may be in direct contact with the touch insulating layer 410 via the first opening 420OP of the first insulating layer 420.

The second insulating layer 430 may include a material having a greater refractive index than a refractive index of the first insulating layer 420, for example, an organic material. Light L emitted by the organic light-emitting diode OLED and propagating in a direction oblique to a direction perpendicular to the upper surface of the substrate 100 (z direction) may be totally reflected at the side surface 420S of the first insulating layer 420, and proceed outwardly of the display apparatus 10, and thus, the light-emission efficiency of the organic light-emitting diode OLED may be improved, and luminance of the display apparatus 10 may be increased.

The refractive index of the first insulating layer 420 may range from about 1.3 to 1.6. In some embodiments, the refractive index of the first insulating layer 420 may range from about 1.4 to 1.55. The first insulating layer 420 may include an acrylic organic material having a refractive index of between 1.4 and 1.55. The first insulating layer 420 may include an acrylic resin (for example, polymethyl methacrylate, polyacrylic acid, and the like), ethylhexyl acrylate, pentafluoropropyl acrylate, polyethylene glycol dimethacrylate, or ethylene glycol dimethacrylate. In some embodiments, the first insulating layer 420 may further include a thermal curing agent such as an epoxy, and/or a photocuring agent.

The refractive index of the second insulating layer 430 may range from about 1.65 to 1.85. The second insulating layer 430 may include an acrylic-based or siloxane-based organic material. In some embodiments, the second insulating layer 430 may include polydiarylsiloxane, methyltrimethoxysilane, or tetramethoxysilane. In some embodiments, the second insulating layer 430 may include dispersed particles. For example, metal oxide particles such as zinc oxide ($ZnO_x$), titanium oxide ($TiO_2$), zirconium oxide ($ZrO_2$), and barium titanate ($BaTiO_3$) may be dispersed in the second insulating layer 430. The second insulating layer 430 may be formed by applying an organic material including metal oxide particles by inkjet printing.

The side surface 420S of the first insulating layer 420 may have an inclined surface. In an embodiment, the side surface 420S may include a staircase-shaped step. In this case, a minor angle θ (hereinafter referred to as an inclination angle) between a virtual inclined surface connecting the lower end and the upper end of the side surface 420S and the upper surface of the touch insulating layer 410 may be 20° to 60°. In some embodiments, the inclination angle θ may be 25°≤θ≤55°, or 30°≤θ≤50°.

The second insulating layer 430 may be formed by applying an organic material by inkjet printing and curing the applied organic material. In this case, according to a size, shape, and surface condition of the first opening 420OP of the first insulating layer 420, a pattern of filling the first opening 420OP of the first insulating layer 420 with the organic material may vary.

For example, in a case where the inclination angle of the side surface 420S of the first insulating layer 420 is steep, the second insulating layer 430 may not completely fill the first opening 420OP of the first insulating layer 420, depending on the size of the first opening 420OP of the first insulating layer 420.

In the present embodiment, a step formed on the side surface 420S that defines the first opening 420OP of the first insulating layer 420 and has the inclination angle may facilitate filling of the second insulating layer 430 inside the first opening 420OP of the first insulating layer 420. Therefore, the emission efficiency of the organic light-emitting diode OLED may be uniformly improved for all pixels P.

According to an embodiment, a halftone masking process may be used to form the staircase-shaped step on the side surface 420S of the first insulating layer 420.

In FIG. 7, the conductive layer CTL included in the functional layer 400 includes the first and second sub-conductive layers CTL1 and CTL2, and each of the first and second sensing electrodes SP1 and SP2 may be formed of the conductive layer CTL. However, embodiments are not limited thereto. The functional layer 400 may include a single-body conductive layer CTL arranged below or on the touch insulating layer 410, and each of the first and second sensing electrodes SP1 and SP2 may include a single conductive layer CTL.

Figure 8A:
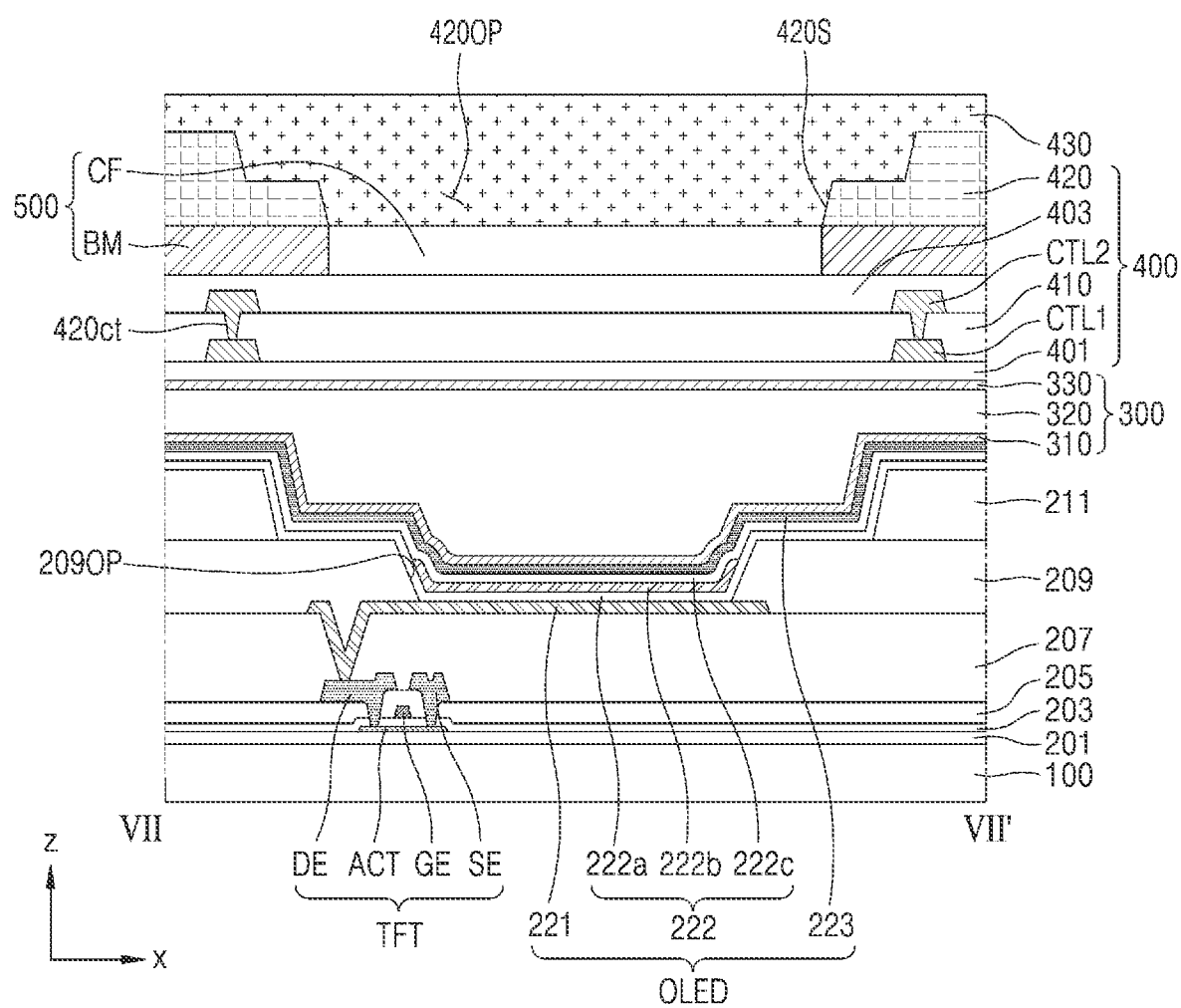
FIGS. 8A and 8B are cross-sectional views schematically illustrating a display apparatus, according to one or more embodiments.
Figure 8B:
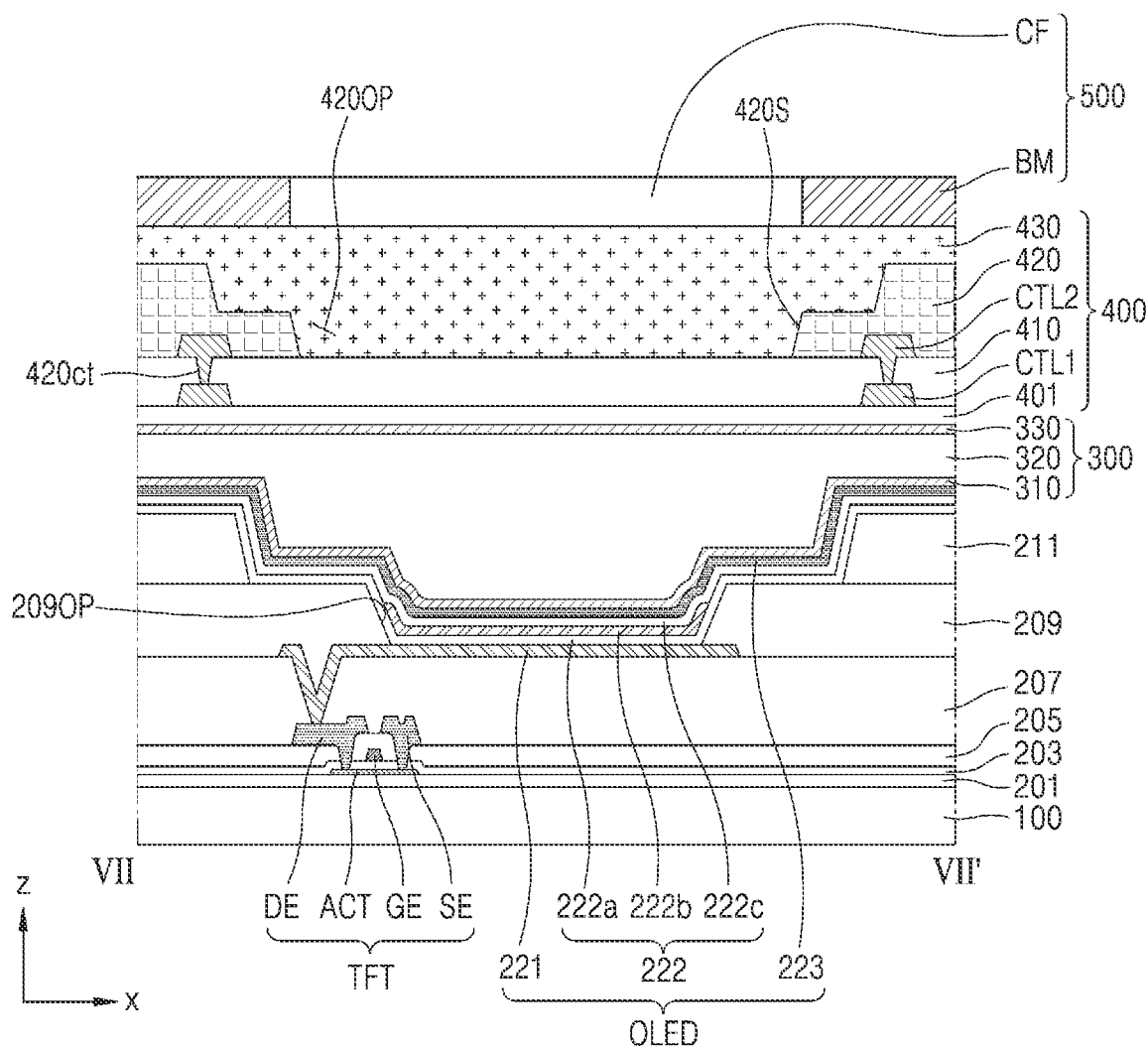

FIGS. 8A and 8B are schematic cross-sectional views of the display apparatus 10, according to one or more embodiments. In FIGS. 8A and 8B, the same reference numerals as those of FIG. 7 denote the same.

Referring to FIGS. 8A and 8B, the display apparatus 10 may further include the anti-reflection layer 500. In some embodiments, the anti-reflection layer 500 may include a color filter CF that overlaps the light-emitting area EA and a black matrix BM that overlaps a non-light-emitting area.

As shown in FIG. 8A, the anti-reflection layer 500 may be arranged in a middle of the functional layer 400. For example, the color filter CF of the anti-reflection layer 500 may be arranged between the touch insulating layer 410 and the second insulating layer 430 in the light-emitting area EA, and the black matrix BM of the anti-reflection layer 500 may be arranged between the touch insulating layer 410 and the first insulating layer 420 in the non-light-emitting area. A touch protection layer 403 may be arranged below the anti-reflection layer 500. The touch protection layer 403 may be provided on the entire surface of the substrate 100 to cover and protect the second sub-conductive layer CTL2. The touch protection layer 403 may include an inorganic material and/or an organic material.

In another embodiment, the anti-reflection layer 500 may be directly arranged on the functional layer 400 as shown in FIG. 8B. In this case, the touch protection layer 403 may be omitted.

Figure 9:
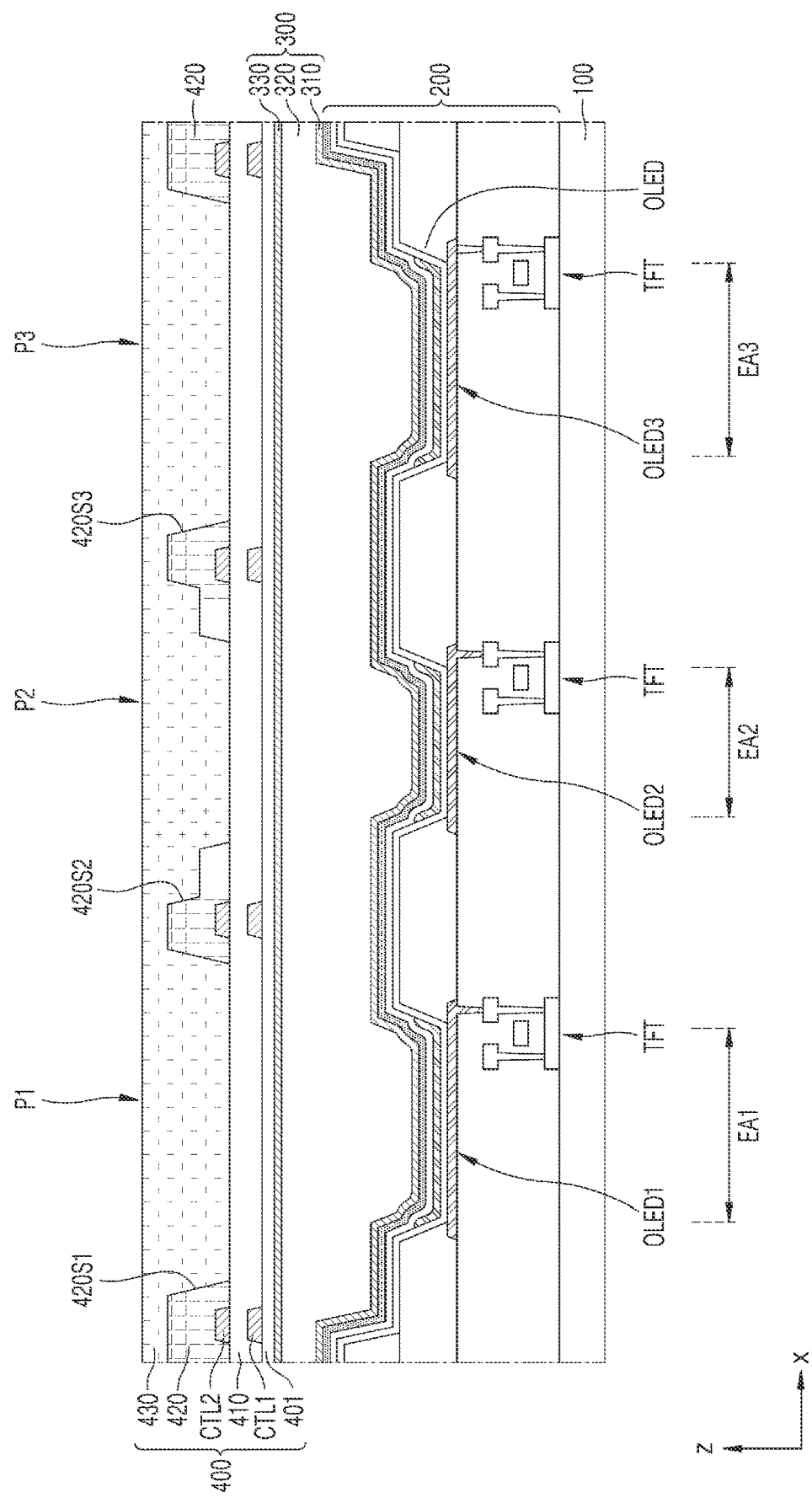
FIG. 9 is a cross-sectional view schematically illustrating a display apparatus, according to an embodiment.

FIG. 9 is a cross-sectional view schematically illustrating the display apparatus 10, according to an embodiment.

A first pixel P1, a second pixel P2, and a third pixel P3 emitting light of different colors from each other are arranged in the display area DA, and display elements are arranged for each of the first pixel P1, the second pixel P2, and the third pixel P3. For example, the display layer 200 arranged on the substrate 100 may include a first organic light-emitting diode OLED1, a second organic light-emitting diode OLED2, and a third organic light-emitting diode OLED3 as display elements, as shown in FIG. 8, respectively corresponding to the first pixel P1, the second pixel P2, and the third pixel P3. Each of the first organic light-emitting diode OLED1, the second organic light-emitting diode OLED2, and the third organic light-emitting diode OLED3 is electrically connected to the TFT, and a detailed structure of the display layer 200 is described above with reference to FIG. 7.

The first organic light-emitting diode OLED1 emits light of a first color, the second organic light-emitting diode OLED2 emits light of a second color, and the third organic light-emitting diode OLED3 emits light of a third color. Each of the light of the first color emitted from the first light-emitting area EA1, the light of the second color emitted from the second light-emitting area EA2, and the light of the third color emitted from the third light-emitting area EA3 may be totally reflected on the side surface 420S of the first insulating layer 420 and may proceed outwardly of the display apparatus 10.

In the present embodiment, a size of the second pixel P2, that is, a size of the light-emitting area EA of the second organic light-emitting diode OLED2, may be less than a size of each of the first pixel P1 and the third pixel P3. In some embodiments, the second pixel P2 may be a green pixel.

In an embodiment, a step may be provided only on a side surface 420S2 of the first insulating layer 420 that corresponds to the second organic light-emitting diode OLED2. As the width of the first opening 420OP of the first insulating layer 420 decreases, the second insulating layer 430 may not be fully filled in the first opening 420OP of the first insulating layer 420. Therefore, a step may not be provided on a side surface 420S1 of the first opening 420OP corresponding to the first pixel P1 and on a side surface 420S3 of the first opening 420OP corresponding to the third pixel P3, but may be provided only on the side surface 420S2 defining the first opening 420OP corresponding to the second pixel P2. In this case, inclination angles of the side surface 420S1 of the first opening 420OP corresponding to the first pixel P1 and the side surface 420S3 of the first opening 420OP corresponding to the third pixel P3 may be at least 70 degrees.

Figure 10:
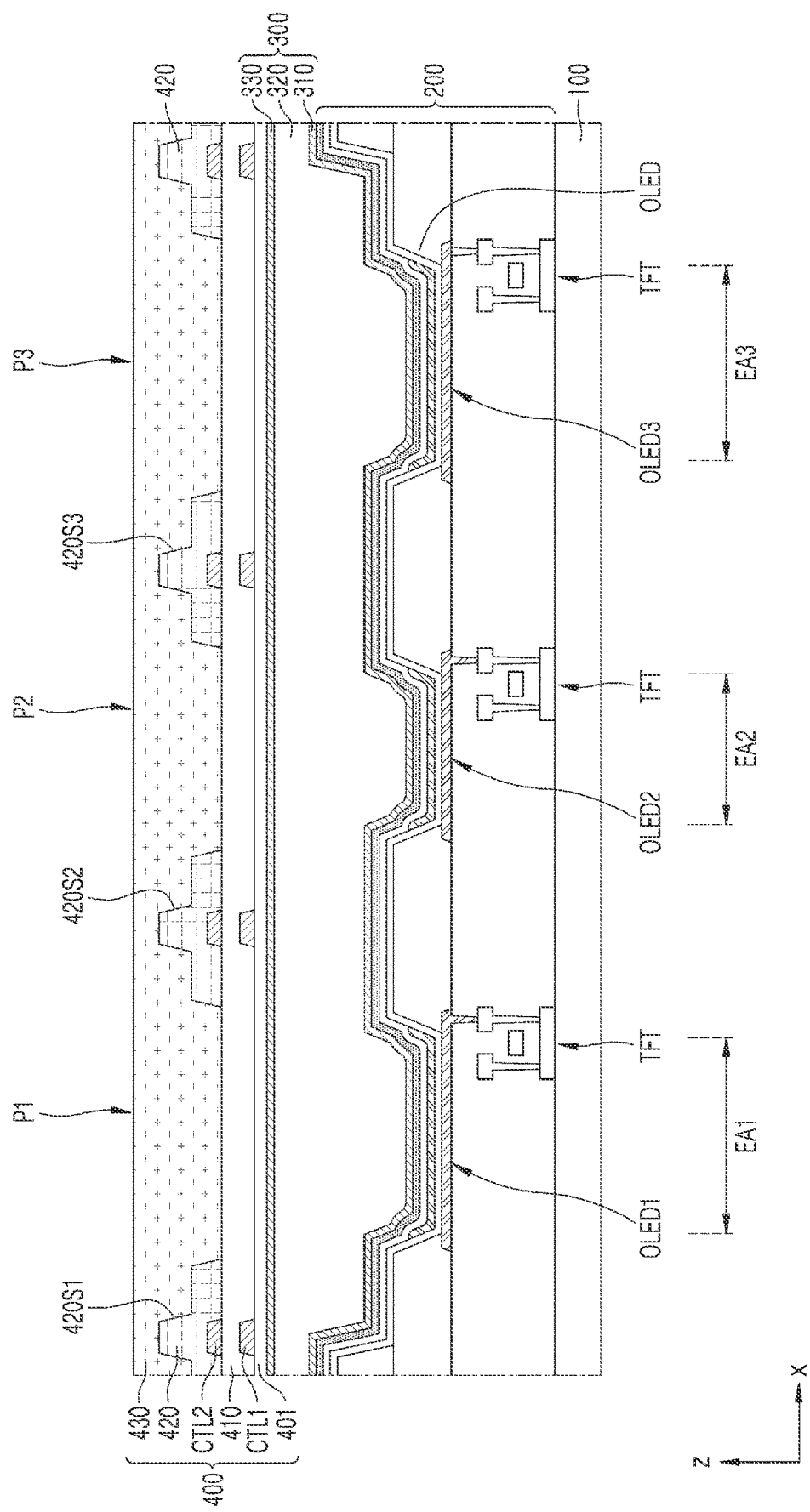
FIG. 10 is a cross-sectional view schematically illustrating a display apparatus, according to another embodiment.

However, the present disclosure is not limited thereto. As shown in the embodiment shown in FIG. 10, a step may be provided in at least two or all of the side surfaces 420S1, 420S2, and 420S3 that correspond to the first pixel P1, the second pixel P2, and the third pixel P3, respectively.

Figure 11:
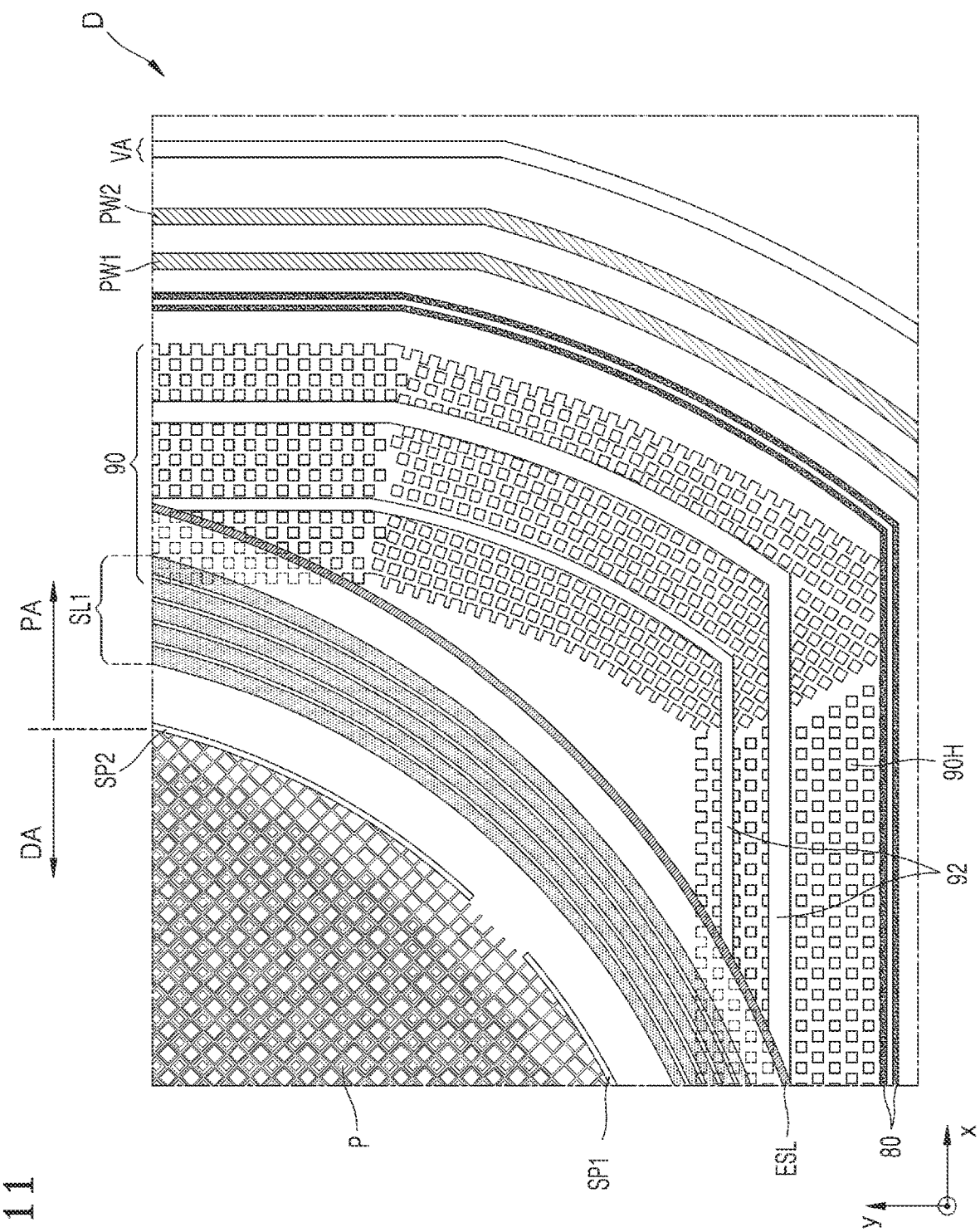
FIG. 11 is an enlarged plan view schematically illustrating a region D of the display apparatus shown in FIG. 1, according to an embodiment.

FIG. 11 is an enlarged plan view schematically illustrating the region D of the display apparatus 10 shown in FIG. 1, according to an embodiment.

Referring to FIG. 11, the first and second sensing electrodes SP1 and SP2 included in the functional layer 400 may be arranged in the display area DA as described above. FIG. 11 shows some of the first sensing electrode SP1 and the second sensing electrode SP2 as examples of the sensing electrodes.

Signal lines may be arranged on the outer periphery of the display area DA in the peripheral area PA. FIG. 11 shows first signal lines SL1 for transmitting a scan signal as examples of the signal lines.

An anti-static line ESL may be arranged on the outer periphery of the first signal lines SL1 in the peripheral area PA. A static voltage may be applied to the anti-static line ESL to prevent damage by static electricity.

A shield layer 90 may be arranged on the outer periphery of the anti-static line ESL. The shield layer 90 may be arranged in the same layer as the pixel electrode 221 (see FIG. 7) and may include the same material as the pixel electrode 221. A driving circuit may be arranged below the shield layer 90. A plurality of through-holes 90H may be formed in the shield layer 90. The planarization insulating layer 207 (see FIG. 7) may be arranged between the driving circuit and the shield layer 90, and outgas generated from the planarization insulating layer 207 during the manufacturing process may be easily discharged through the plurality of through-holes 90H.

An anti-reflection member 92 may be arranged on the shield layer 90. Although not shown, a valley structure (not shown) formed by removing a portion of the planarization insulating layer 207 may be provided in the planarization insulating layer 207 below the shield layer 90. The valley structure may block external moisture permeation that may be introduced through the planarization insulating layer 207 that includes an organic insulating material to prevent impurities from flowing into the display area DA. In addition, the valley structure may also prevent an overflow of the material forming the organic encapsulation layer 320 (see FIG. 7) included in the encapsulation layer 300 (see FIG. 7).

The anti-reflection member 92 may overlap the valley structure and may prevent the valley structure from being visually recognized from the outside in a case where the external light is reflected by the valley structure. For example, the anti-reflection member 92 may include the same material as the sensing electrodes of the functional layer 400.

In another embodiment, a crack detection line 80 may be arranged on the outer periphery of the shield layer 90. In an embodiment, in a case where the display apparatus 10 includes a transmissive portion (not shown) that penetrates through the substrate 100 in the display area DA and/or the peripheral area PA, the crack detection line 80 may detect a crack in the layers around the transmissive portion. In another embodiment in which the display apparatus 10 may not include a transmissive portion, the crack detection line 80 may be omitted.

A first partition wall PW1 and a second partition wall PW2 may be arranged on the outer periphery of the crack detection line 80. Further, a valley portion VA may be arranged on the outer periphery of the first partition wall PW1 and the second partition wall PW2. The first partition wall PW1, the second partition wall PW2, and the valley portion VA will be described in further detail with reference to FIG. 12.

Figure 12:
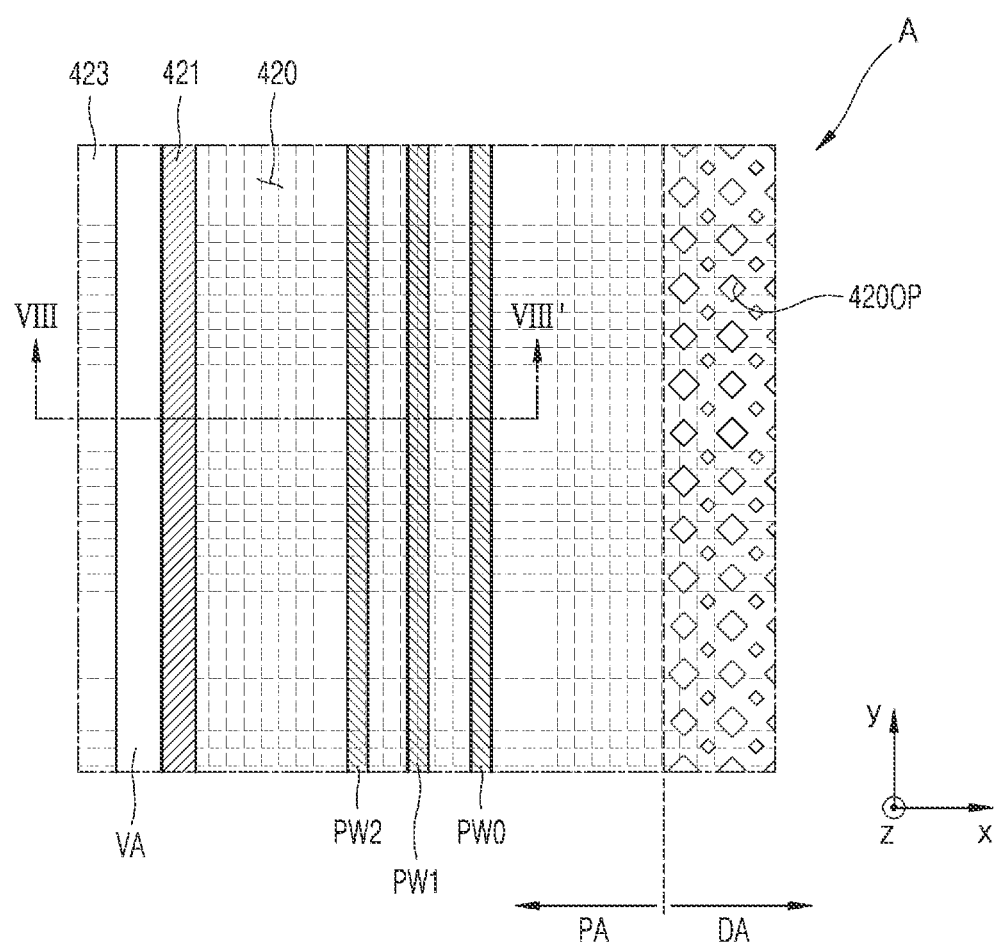
FIG. 12 is an enlarged plan view schematically illustrating a region A of the display apparatus shown in FIG. 1, according to an embodiment.
Figure 13:
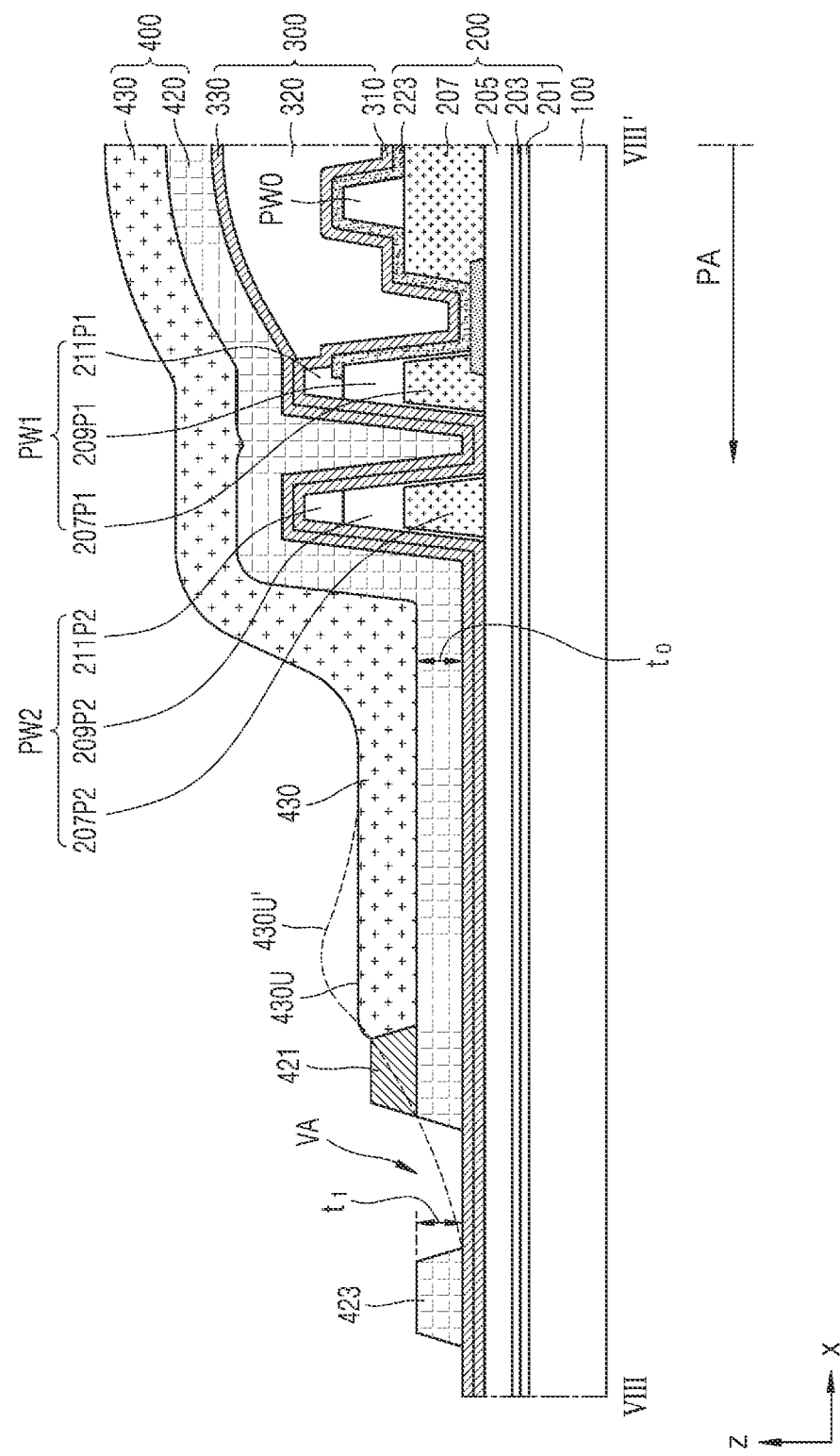
FIG. 13 is a cross-sectional view taken along line VIII-VIII' of a display apparatus shown in FIG. 12, according to an embodiment.

FIG. 12 is an enlarged plan view schematically illustrating the region A of the display apparatus 10 shown in FIG. 1, according to an embodiment. FIG. 13 is a cross-sectional view taken along line VIII-VIII' of the display apparatus 10 shown in FIG. 12, according to an embodiment.

Referring to FIGS. 12 and 13, the display apparatus 10 may include a protruding dam 421 arranged on the first insulating layer 420 in the peripheral area PA. The first insulating layer 420 may include a plurality of first openings 420OP in the display area DA and the protruding dam 421 arranged on the upper surface of the first insulating layer 420 in the peripheral area PA. The protruding dam 421 may at least partially surrounds the circumference of the display area DA.

The display apparatus 10 may further include an upper dam 423 that is spaced apart from the protruding dam 421. The valley portion VA that corresponds to a removed portion of the first insulating layer 420 may be arranged between the protruding dam 421 and the upper dam 423.

Meanwhile, an auxiliary partition wall PW0, the first partition wall PW1, and the second partition wall PW2 may be between the protruding dam 421 and the display area DA in the peripheral area PA in the order adjacent to the display area DA. The auxiliary partition wall PW0, the first partition wall PW1, and the second partition wall PW2 may be spaced apart from each other at predetermined intervals.

In FIG. 13, the first partition wall PW1 may include a portion 207P1 of the planarization insulating layer 207, a portion 209P1 of the pixel defining layer 209, and a portion 211P1 of the spacer 211, and the second partition wall PW2 may include a portion 207P2 of the planarization insulating layer 207, a portion 209P2 of the pixel defining layer 209, and a portion 211P2 of the spacer 211, but the present disclosure is not limited thereto.

The auxiliary partition wall PW0 may be a single layer arranged on the planarization insulating layer 207. In this case, the auxiliary partition wall PW0 may include the same material as the pixel defining layer 209 or the spacer 211. In another embodiment, the auxiliary partition wall PW0 may be arranged on the interlayer insulating layer 205. In this case, the auxiliary partition wall PW0 may include the same material as the planarization insulating layer 207.

The first partition wall PW1 and the second partition wall PW2 may surround the display area DA and prevent the organic encapsulation layer 320 of the encapsulation layer 300 from overflowing outwardly of the display apparatus 10. The organic encapsulation layer 320 may contact the inner surface of the first partition wall PW1 that faces the display area DA. In this case, the organic encapsulation layer 320 contacts the inner surface of the first partition wall PW1 so that the first inorganic encapsulation layer 310 is arranged between the organic encapsulation layer 320 and the first partition wall PW1, and the organic encapsulation layer 320 is in direct contact with the first inorganic encapsulation layer 310. The first inorganic encapsulation layer 310 and the second inorganic encapsulation layer 330 may be arranged on the first partition wall PW1 and the second partition wall PW2 and may extend to ends of the substrate 100. The first inorganic encapsulation layer 310 and the second inorganic encapsulation layer 330 may directly contact each other outside the second partition wall PW2. Thus, ambient air such as oxygen or moisture may be prevented from penetrating into the display layer 200.

The functional layer 400 may be arranged on the upper surface of the second inorganic encapsulation layer 330, and may further include the protruding dam 421 arranged on the first insulating layer 420 in the peripheral area PA and the upper dam 423 spaced apart from the protruding dam 421.

The protruding dam 421 may be arranged on the upper surface of the first insulating layer 420 that extends from the display area DA to the peripheral area PA. The protruding dam 421 may protrude from the upper surface of the first insulating layer 420. The protruding dam 421 may flatten an upper surface 430U of the second insulating layer 430 formed of an organic material.

In a case where the protruding dam 421 is not provided, a flow of the organic material forming the second insulating layer 430 may be controlled by a contact angle with the upper surface of the first insulating layer 420, and thus, an upper surface 430U' of the second insulating layer 430 may have a shape as indicated by a dotted line in FIG. 13. That is, when there is no protruding dam 421, the upper surface on the outer periphery of the second insulating layer 430 may have a convex shape instead of a flat surface. In this case, the second insulating layer 430 may act like a lens to reflect or refract light incident from the outside of the display apparatus 10 in an undesired direction so that a spot pattern may be generated on an outer periphery portion of the display apparatus 10.

In the present embodiment, the protruding dam 421 protruding from the upper surface of the first insulating layer 420 and provided at an end of the first insulating layer 420 or at one side of the valley portion VA that is provided in the first insulating layer 420 may be used to control a flow of the organic material while providing the upper surface 430U of the second insulating layer 430 to be flat. Therefore, the protruding dam 421 may significantly reduce a spot pattern that may be generated at the outer portion of the display apparatus 10.

The protruding dam 421 may be simultaneously formed of the same material as the first insulating layer 420. In an embodiment, the protruding dam 421 may be integrally formed with the first insulating layer 420. The protruding dam 421 may correspond to a protruding portion protruding from an upper surface of the first insulating layer 420. In this case, the first insulating layer 420 and the protruding dam 421 may be formed by a halftone masking process. However, the present disclosure is not limited thereto. The protruding dam 421 and the first insulating layer 420 may be made of different materials. The upper dam 423 that is spaced apart from the protruding dam 421 may be further arranged outside the protruding dam 421. The upper dam 423 may be made of the same material as the first insulating layer 420. The upper dam 423 may be arranged along the outer periphery of the display area DA. The upper dam 423 may further prevent an overflow of the organic material forming the second insulating layer 430. In some embodiments, a thickness t1 of the upper dam 423 may be substantially equal to a thickness t0 of the first insulating layer 420.

The valley portion VA that is provided by removing the first insulating layer 420 may be arranged between the protruding dam 421 and the upper dam 423. The valley portion VA may include a hole penetrating through the first insulating layer 420 or may be formed as a recess in the thickness direction of the substrate 100 without completely penetrating through the first insulating layer 420. The valley portion VA may be arranged along the outer periphery of the display area DA.

The flow of the organic material forming the second insulating layer 430 may be controlled by the protruding dam 421, and the second insulating layer 430 may be arranged only at one side of the protruding dam 421. That is, the second insulating layer 430 may not be filled in the valley portion VA.

FIG. 13 illustrates that the second insulating layer 430 is not filled in the valley portion VA, but it is understood that the second insulating layer 430 may be partially filled in the valley portion VA without deviating from the scope of the present disclosure.

Figure 14:
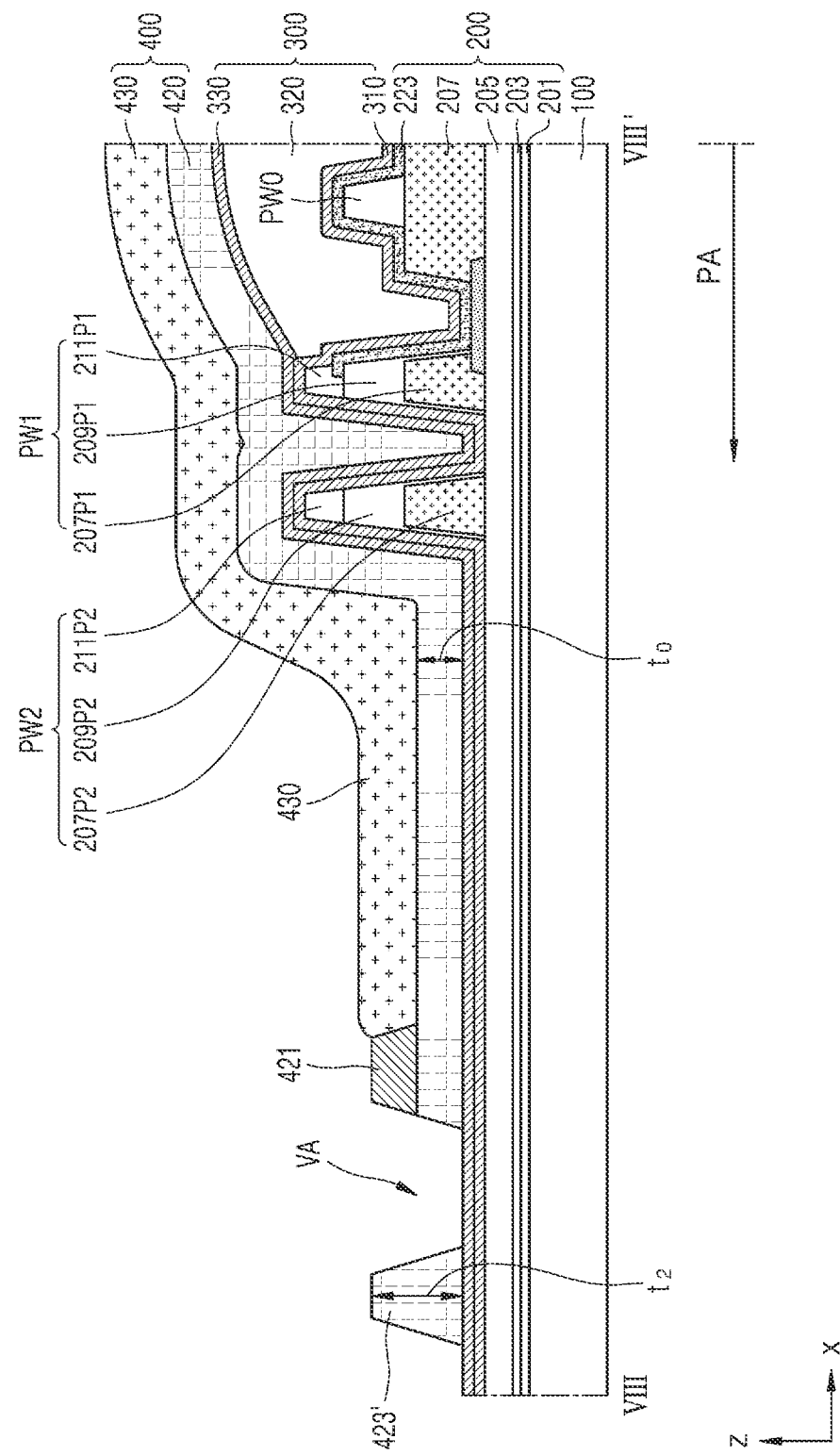
FIG. 14 is a cross-sectional view schematically illustrating a portion of a display apparatus, according to an embodiment.

FIG. 14 is a cross-sectional view schematically illustrating a portion of the display apparatus 10, according to an embodiment. In FIG. 14, the same reference numerals as those of FIG. 13 denote the same, and redundant descriptions thereof will be omitted.

Referring to FIG. 14, the functional layer 400 includes the protruding dam 421 arranged on the first insulating layer 420 in the peripheral area PA and an upper dam 423' spaced apart from the protruding dam 421.

In the present embodiment, a thickness t2 of the upper dam 423' may be greater than the thickness t0 of the first insulating layer 420. For example, the thickness t2 of the upper dam 423' may correspond to a sum of the thickness t0 of the first insulating layer 420 and a thickness of the protruding dam 421.

Figure 15:
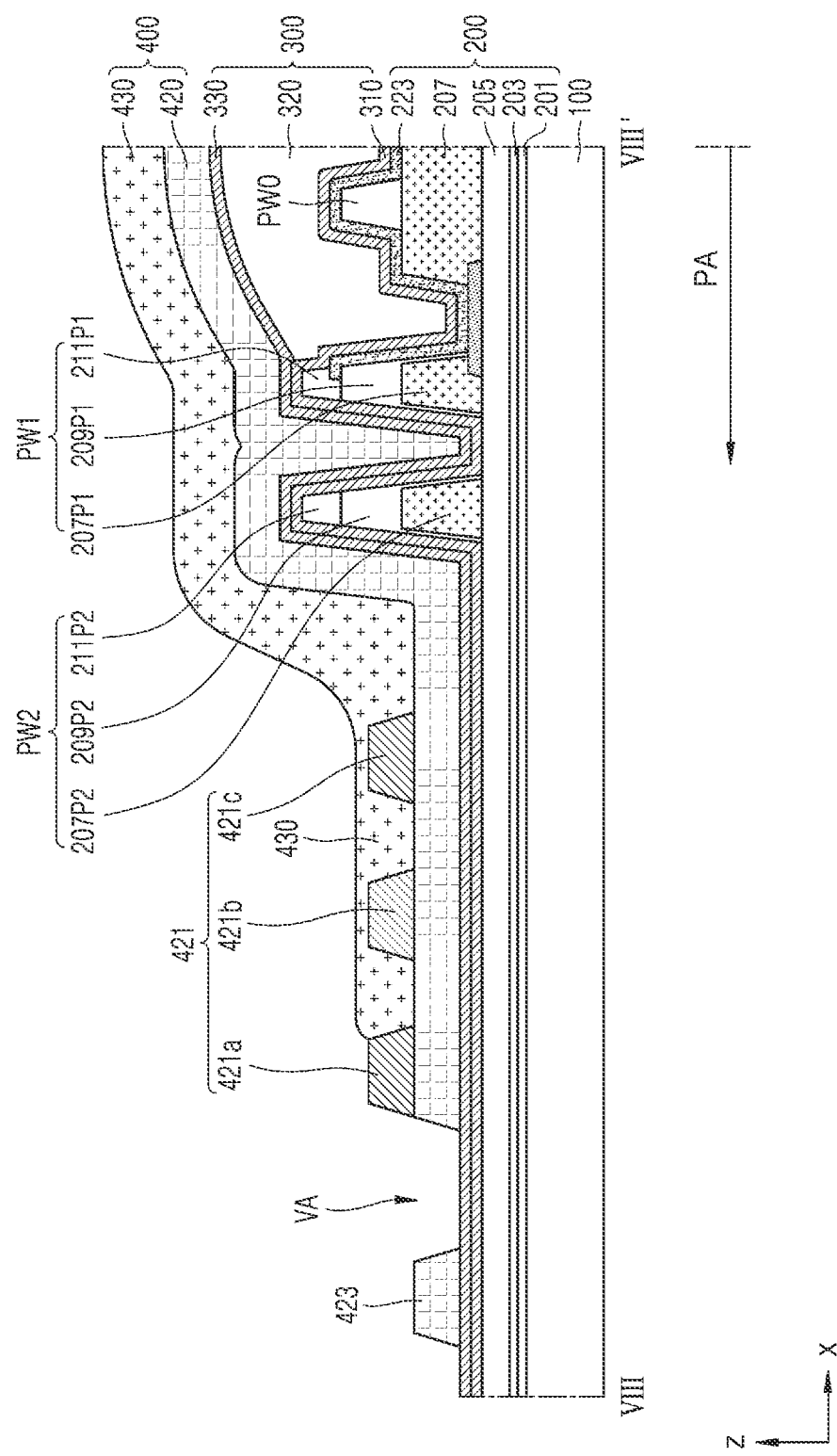
FIG. 15 is a cross-sectional view schematically illustrating a portion of a display apparatus, according to an embodiment.
Figure 16:
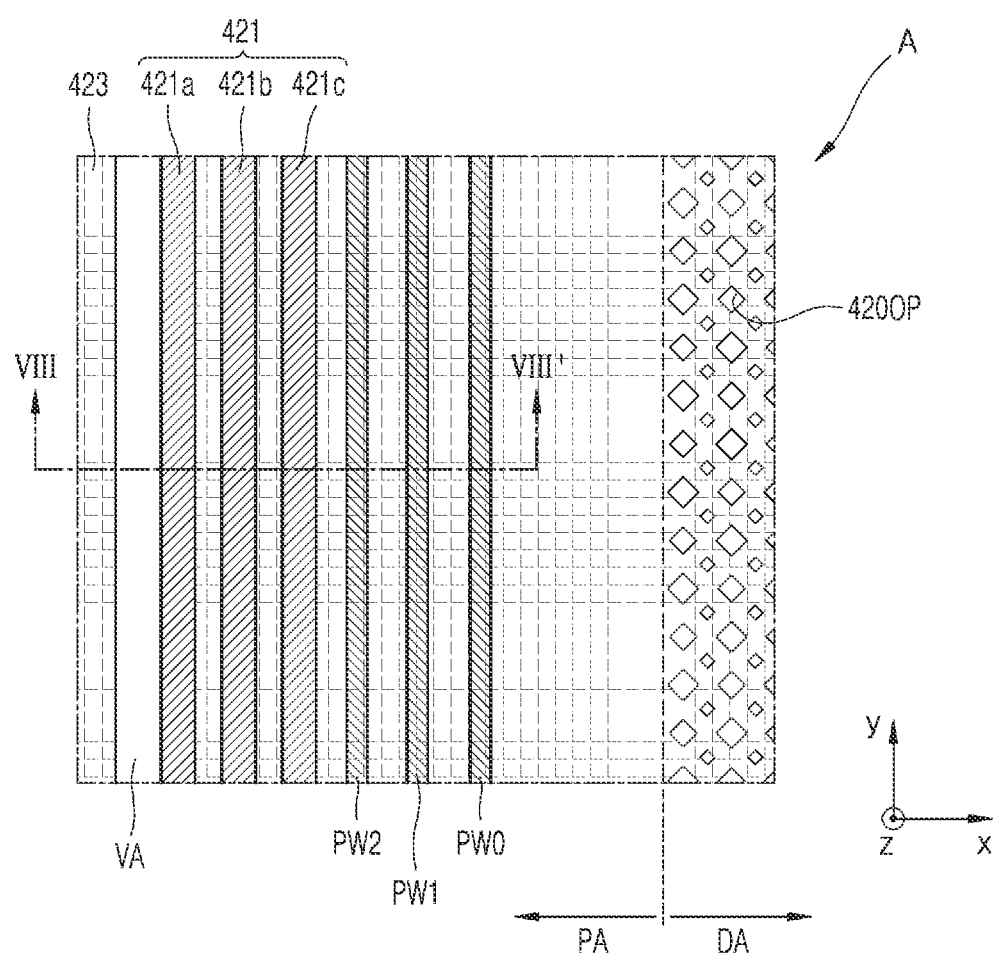
FIG. 16 is a plan view schematically illustrating a portion of a display apparatus, according to an embodiment.
Figure 17:
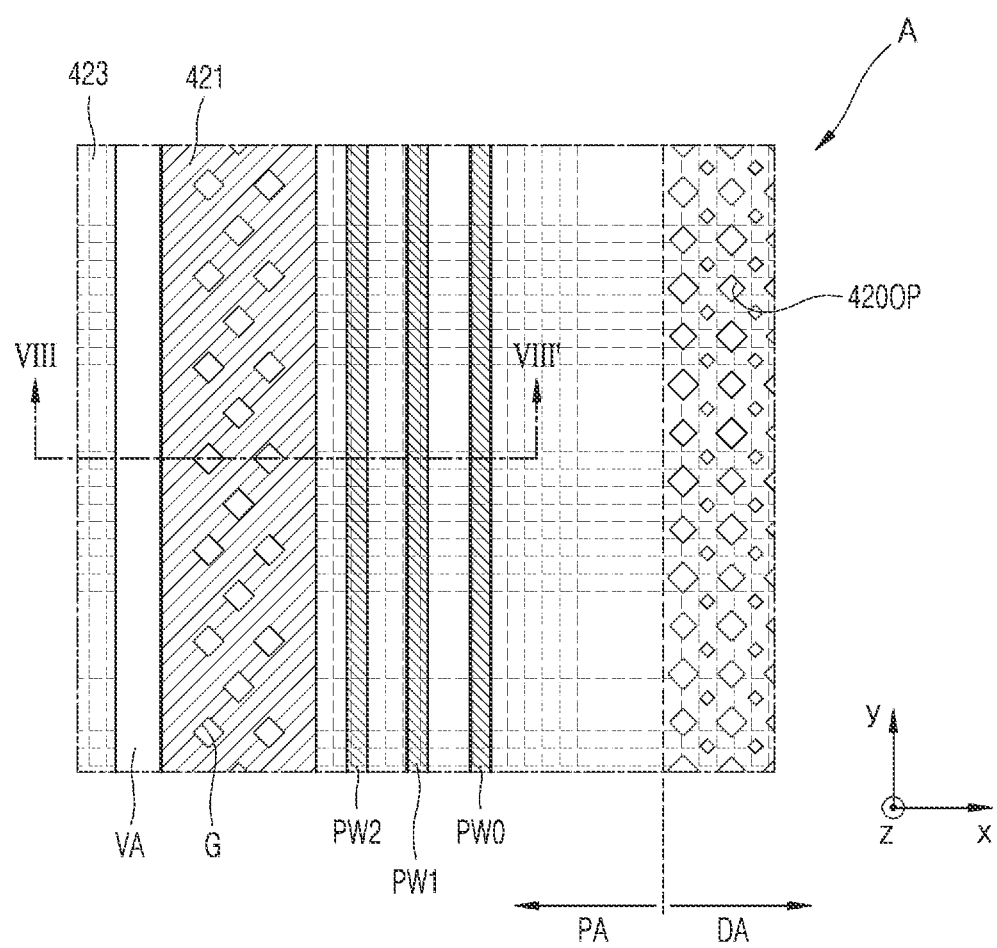
FIG. 17 is a plan view schematically illustrating a portion of a display apparatus, according to an embodiment.

FIG. 15 is a cross-sectional view schematically illustrating a portion of the display apparatus 10, according to an embodiment. FIGS. 16 and 17 are plan views schematically illustrating a portion of the display apparatus 10 of the display apparatus 10 shown in FIG. 15 according to one or more embodiments. In FIG. 15, the same reference numerals as those of FIG. 13 denote the same, and redundant descriptions thereof will be omitted.

Referring to FIG. 15, the functional layer 400 includes the protruding dam 421 arranged on the first insulating layer 420 in the peripheral area PA, and the upper dam 423 spaced apart from the protruding dam 421 with the valley portion VA interposed there between.

In the present embodiment, the protruding dam 421 the protruding dam 421 may include a first protruding dam 421a, a second protruding dam 421b, and a third protruding dam 421c. The plurality of the protruding dams may more precisely control a flow of organic matter forming the second insulating layer 430 compared to a single protruding dam.

The first protruding dam 421a, the second protruding dam 421b, and the third protruding dam 421c may be spaced apart from each other. For example, the first protruding dam 421a, the second protruding dam 421b, and the third protruding dam 421c may be arranged parallel to each other along the outer periphery of the display area DA as shown in FIG. 16.

Alternatively, a plurality of openings or grooves G may be formed in the protruding dam 421 as shown in FIG. 17. In this case, the plurality of protruding dams may be understood as being connected to each other.

Figure 18:
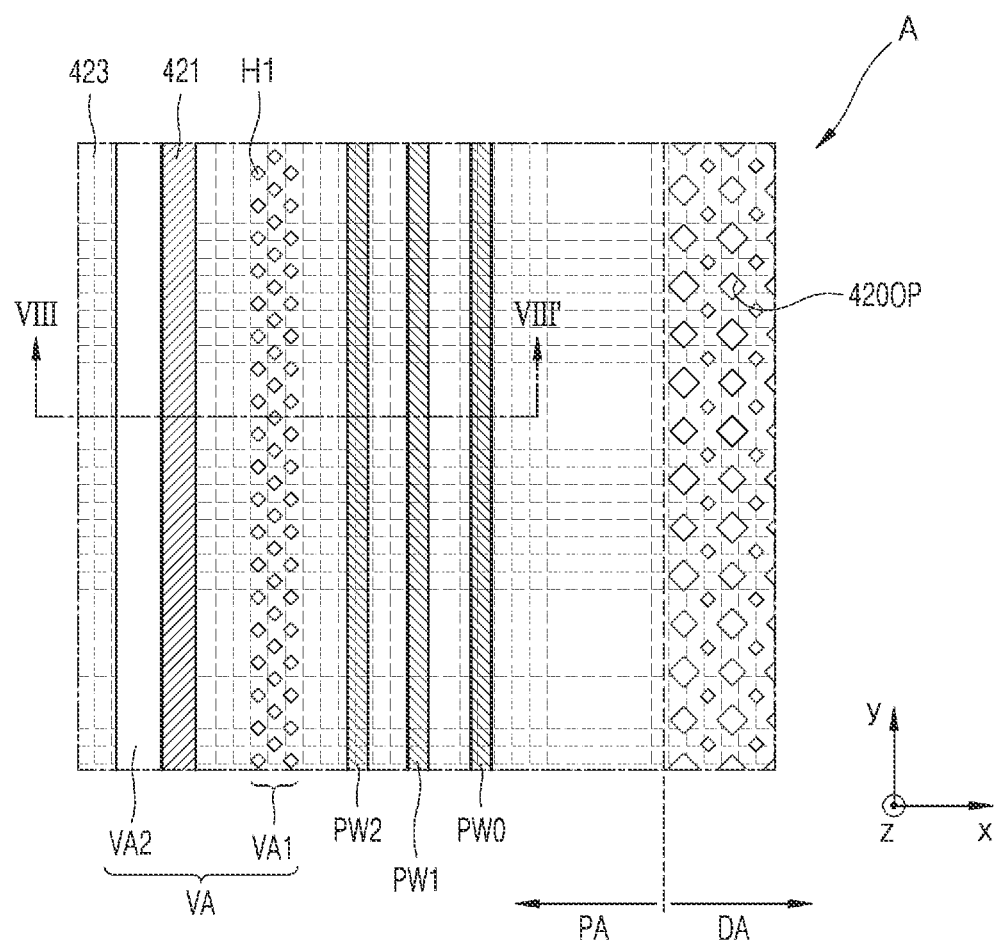
FIG. 18 is a plan view schematically illustrating a portion of a display apparatus, according to an embodiment.

FIG. 18 is a plan view schematically illustrating a portion of the display apparatus 10, according to an embodiment. In FIG. 18, the same reference numerals as those of FIG. 11 denote the same, and redundant descriptions thereof will be omitted.

Referring to FIG. 18, the functional layer 400 of the display apparatus 10 includes the protruding dam 421 arranged on the first insulating layer 420 in the peripheral area PA, and the upper dam 423 spaced apart from the protruding dam 421 with a second valley portion VA2 interposed there between.

In the present embodiment, the valley portion VA may include a first valley portion VA1 and the second valley portion VA2. In this case, the protruding dam 421 may be arranged between the first valley portion VA1 and the second valley portion VA2. In some embodiments, the first valley portion VA1 and the second valley portion VA2 may have different shapes and/or configurations. For example, the first valley portion VA1 may include a plurality of first holes H1 that penetrates through the first insulating layer 420. The plurality of first holes H1 may be arranged along at least one row and at least one column in the first valley portion VA1. Meanwhile, the second valley portion VA2 may include a hole or a recess that extends along the outer periphery of the display area DA.

The plurality of valley portions VA may more precisely control a flow of organic materials forming the second insulating layer 430. The first valley portion VA1 adjacent to the display area DA may serve as a main valley portion for controlling a spread of the second insulating layer 430, and the second valley portion VA2 may serve as an auxiliary valley portion for preventing an overflow of the second insulating layer 430 over the first valley portion VA1. In the present example where the protruding dam 421 is provided between the first valley portion VA1 and the second valley portion VA2, the upper surface of the second insulating layer 430 may be made to be flat.

Figure 19:
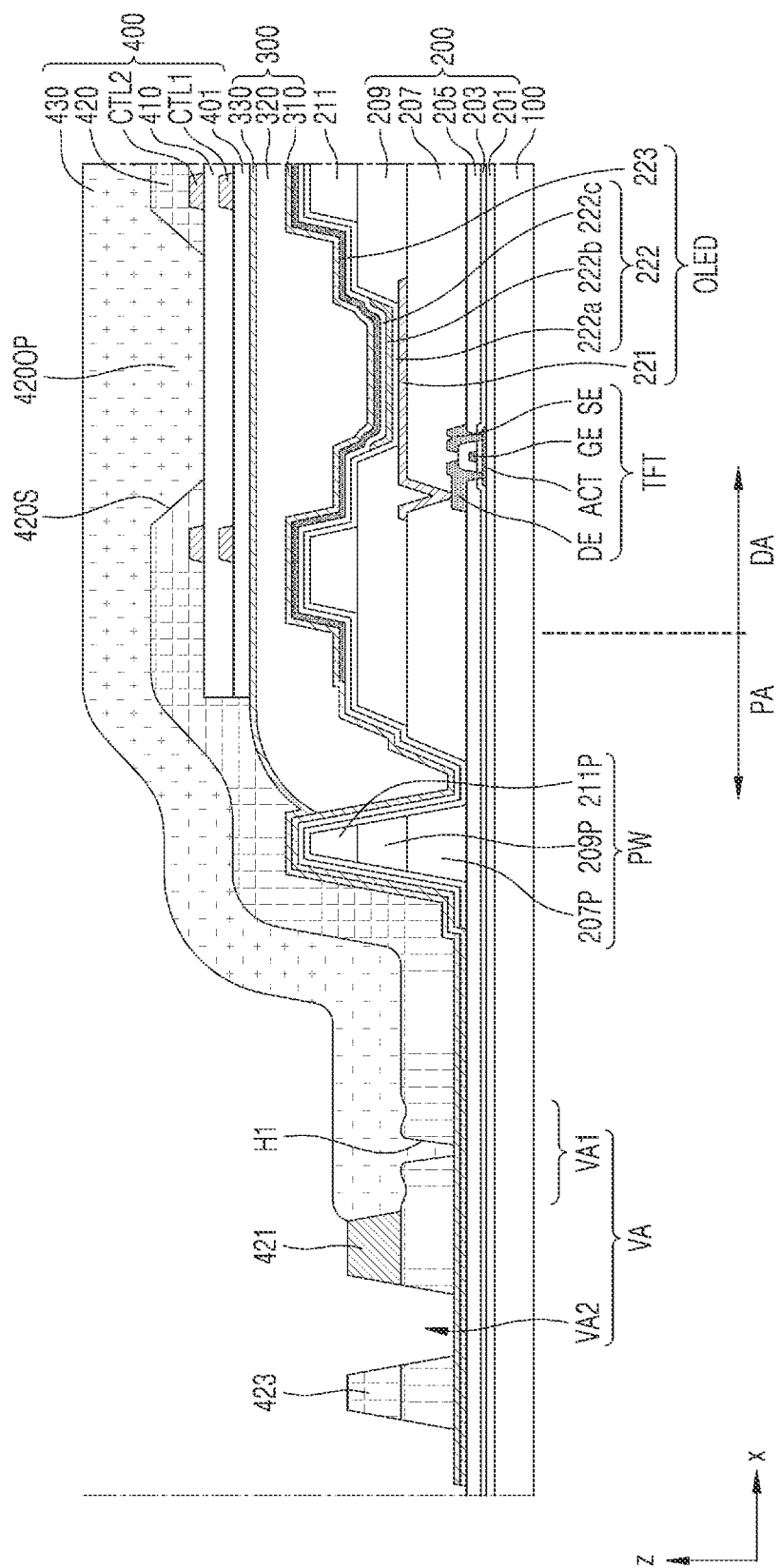
FIG. 19 is a cross-sectional view schematically illustrating a portion of a display apparatus, according to an embodiment.

FIG. 19 is a cross-sectional view schematically illustrating the display apparatus 10, according to an embodiment. In FIG. 19, the same reference numerals as those of FIG. 7 denote the same.

Referring to FIG. 19, the display apparatus 10 includes the substrate 100, the display layer 200 arranged on the substrate 100, the encapsulation layer 300 and the functional layer 400 arranged on the display layer 200.

The functional layer 400 may include the first insulating layer 420 including the first opening 420OP, and the second insulating layer 430 filling the first opening 420OP of the first insulating layer 420 and having a higher refractive index than the first insulating layer 420. In addition, the functional layer 400 may further include the touch buffer layer 401, the first sub-conductive layer CTL1, the second sub-conductive layer CTL2, and the touch insulating layer 410.

A plurality of valley portions VA including the first valley portion VA1 and the second valley portion VA2 may be arranged in the peripheral area PA of the display apparatus 10. In this case, the protruding dam 421 may be arranged between the first valley portion VA1 and the second valley portion VA2. The second valley portion VA2 may be arranged between upper dam 423 and the protruding dam 421.

In some embodiments, the first valley portion VA1 and the second valley portion VA2 may have different shapes and/or configurations. For example, the first valley portion VA1 may include the plurality of first holes H1 that penetrates through the first insulating layer 420. The plurality of first holes H1 may be arranged along at least one row and at least one column as shown in FIG. 18. The second insulating layer 430 may be at least partially filled in the first hole H1. The second valley portion VA2 may include a hole or a recess that extends along the outer periphery of the display area DA. The plurality of valley portions VA may more precisely control a flow of organic materials forming the second insulating layer 430.

In the peripheral area PA, the protruding dam 421 protruding from the upper surface of the first insulating layer 420 may be provided on the first insulating layer 420. The protruding dam 421 may be arranged on the encapsulation layer 300 and may overlap the first inorganic encapsulation layer 310 and the second inorganic encapsulation layer 330 of the encapsulation layer 300. The protruding dam 421 may not overlap the organic encapsulation layer 320.

Meanwhile, a partition wall PW for controlling the flow of the organic encapsulation layer 320 of the encapsulation layer 300 may be arranged in the peripheral area PA. The partition wall PW may be spaced apart from the planarization insulating layer 207 and the pixel defining layer 209. The partition wall PW may have a single-layer or multi-layer structure. In the present shown in FIG. 19, the partition wall PW may have a stacked structure including a first layer 207P, a second layer 209P, and a third layer 211P. In this case, the first layer 207P may be simultaneously formed of the same material as the planarization insulating layer 207, the second layer 209P may be simultaneously formed of the same material as the pixel defining layer 209, and the third layer 211P may be simultaneously formed of the same material as the spacer 211. The partition wall PW may be plural as shown in FIG. 13.

The first inorganic encapsulation layer 310 and the second inorganic encapsulation layer 330 of the encapsulation layer 300 directly contact each other outside the partition wall PW so that the organic encapsulation layer 320 may not be exposed to the outside. That is, it is possible to prevent the penetration of ambient air or moisture caused by organic materials.

In the display area DA, the side surfaces 420S defining the first opening 420OP of the first insulating layer 420 may not include a step. Alternatively, each of the side surfaces 420S may have a gentle slope with respect to the upper surface of the substrate 100. In some embodiments, the inclination angle may be 25°≤θ≤55°, or 30°≤θ≤50°. In another embodiment, a step may be in the side surfaces 420S defining the first opening 420OP of the first insulating layer 420. Such a step may be applied to all pixels or only some pixels, and various modifications are possible.

Figure 20:
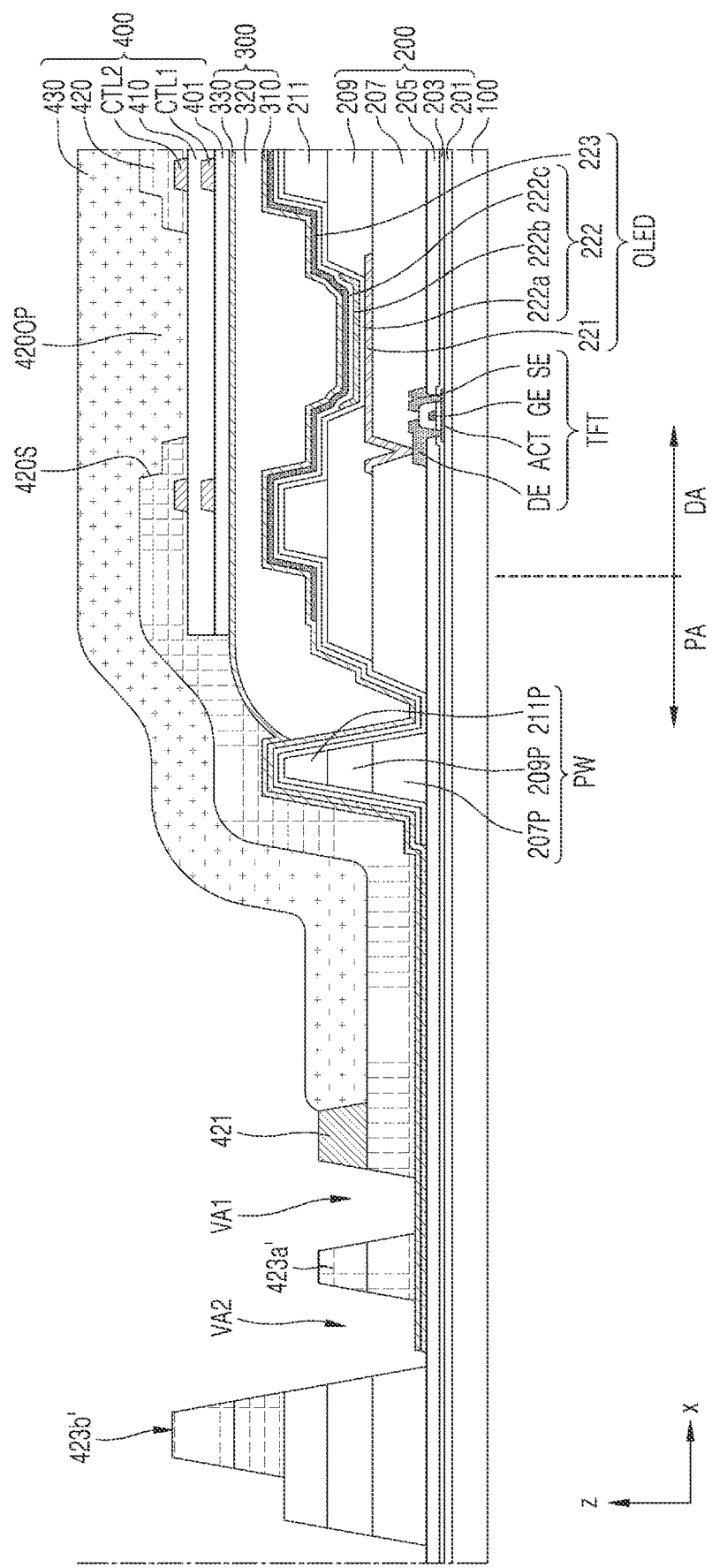
FIG. 20 is a cross-sectional view schematically illustrating a portion of a display apparatus, according to an embodiment.

FIG. 20 is a cross-sectional view schematically illustrating the display apparatus 10, according to an embodiment. In FIG. 20, the same reference numerals as those of FIG. 7 denote the same.

Referring to FIG. 20, the display apparatus 10 includes the substrate 100, the display layer 200 arranged on the substrate 100, the encapsulation layer 300 and the functional layer 400 arranged on the display layer 200.

The functional layer 400 includes the first insulating layer 420 and the second insulating layer 430, wherein the first insulating layer 420 includes the first opening 420OP, and the second insulating layer 430 fills the first opening 420OP of the first insulating layer 420 and has a higher refractive index than the first insulating layer 420. In addition, the functional layer 400 may further include the touch buffer layer 401, the first sub-conductive layer CTL1, the second sub-conductive layer CTL2, and the touch insulating layer 410.

In the display area DA, a staircase-shaped step may be formed at the side surfaces 420S defining the first opening 420OP of the first insulating layer 420. Such a step may be applied to all pixels or only some pixels, and various modifications are possible.

In the peripheral area PA, the protruding dam 421 protruding from the upper surface of the first insulating layer 420 may be arranged on the upper portion of the first insulating layer 420. The protruding dam 421 may be arranged on the encapsulation layer 300 and may overlap the first inorganic encapsulation layer 310 and the second inorganic encapsulation layer 330 of the encapsulation layer 300. The protruding dam 421 may not overlap the organic encapsulation layer 320.

In the peripheral area PA, the partition wall PW for controlling the flow of the organic encapsulation layer 320 of the encapsulation layer 300 may be arranged. The partition wall PW may be spaced apart from the planarization insulating layer 207 and the pixel defining layer 209. The partition wall PW may have a single-layer or multi-layer structure. As shown, the partition wall PW may be provided by stacking the first layer 207P, the second layer 209P, and the third layer 211P. In this case, the first layer 207P may be simultaneously formed of the same material as the planarization insulating layer 207, the second layer 209P may be simultaneously formed of the same material as the pixel defining layer 209, and the third layer 211P may be simultaneously formed of the same material as the spacer 211. The partition wall PW may correspond to one of the first partition wall PW1 and the second partition wall PW2 including a plurality of layers as shown in FIG. 13.

The first inorganic encapsulation layer 310 and the second inorganic encapsulation layer 330 of the encapsulation layer 300 may directly contact each other outside the partition wall PW so that the organic encapsulation layer 320 may not be exposed to the outside. This may prevent ambient air or moisture that may be caused by organic materials from penetrating into the organic encapsulation layer 320.

The first valley portion VA1 may be arranged outside the protruding dam 421, and a first upper dam 423a' may be arranged outside the first valley portion VA1. The first valley portion VA1 may be formed by removing the first insulating layer 420 and may extend along the outer periphery of the display area DA. Alternatively, the first valley portion VA1 may include a plurality of holes that penetrate through the first insulating layer 420.

The second valley portion VA2 may be arranged outside of the first upper dam 423a'. The second valley portion VA2 may be an area provided by removing therefrom the first insulating layer 420 and an organic material layer below the first insulating layer 420.

A second upper dam 423b' may be arranged outside of the second valley portion VA2. The second upper dam 423b' may be an outer dam arranged at the outermost periphery of the peripheral area PA. The second upper dam 423b' may be provided by stacking a plurality of insulating layers. For example, the second upper dam 423b' may be provided by stacking a first layer corresponding to the planarization insulating layer 207, a second layer corresponding to the pixel defining layer 209, a third layer corresponding to the spacer 211, a fourth layer corresponding to the first insulating layer 420, and a fifth layer corresponding to the protruding dam 421.

In the display apparatus 10 according to the present embodiments, a step is formed in the first opening 420OP of the first insulating layer 420 to facilitate filling of the second insulating layer 430 inside the first opening 420OP of the first insulating layer 420. In addition, the display apparatus 10 according to the present embodiments includes the protruding dam 421 arranged on the first insulating layer 420 so that the upper surface of the second insulating layer 430 may be made to be flat.

Figure 21:
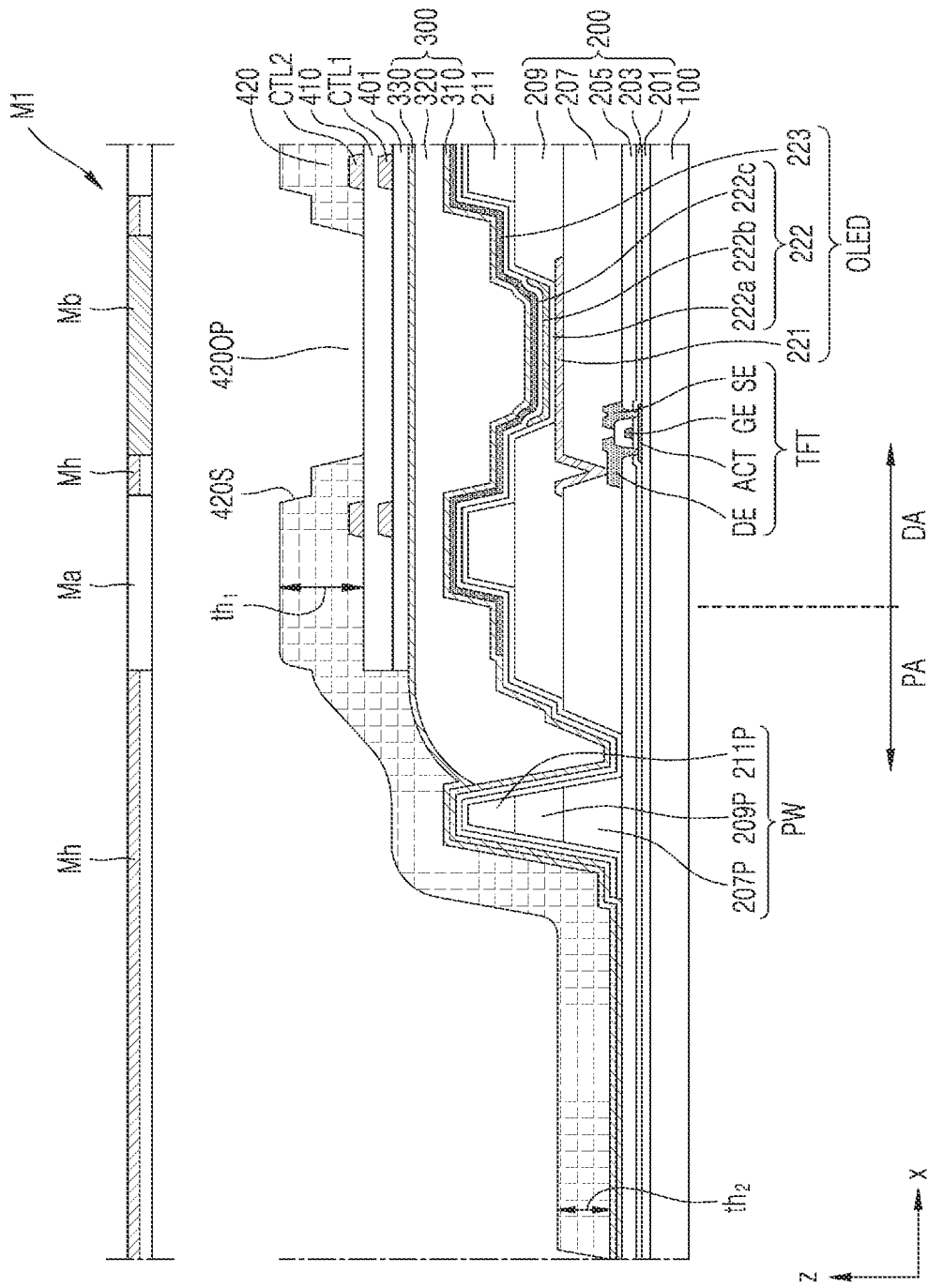
FIGS. 21, 22, and 23 are cross-sectional views illustrating a method of manufacturing a display apparatus, according to one or more embodiments.
Figure 22:
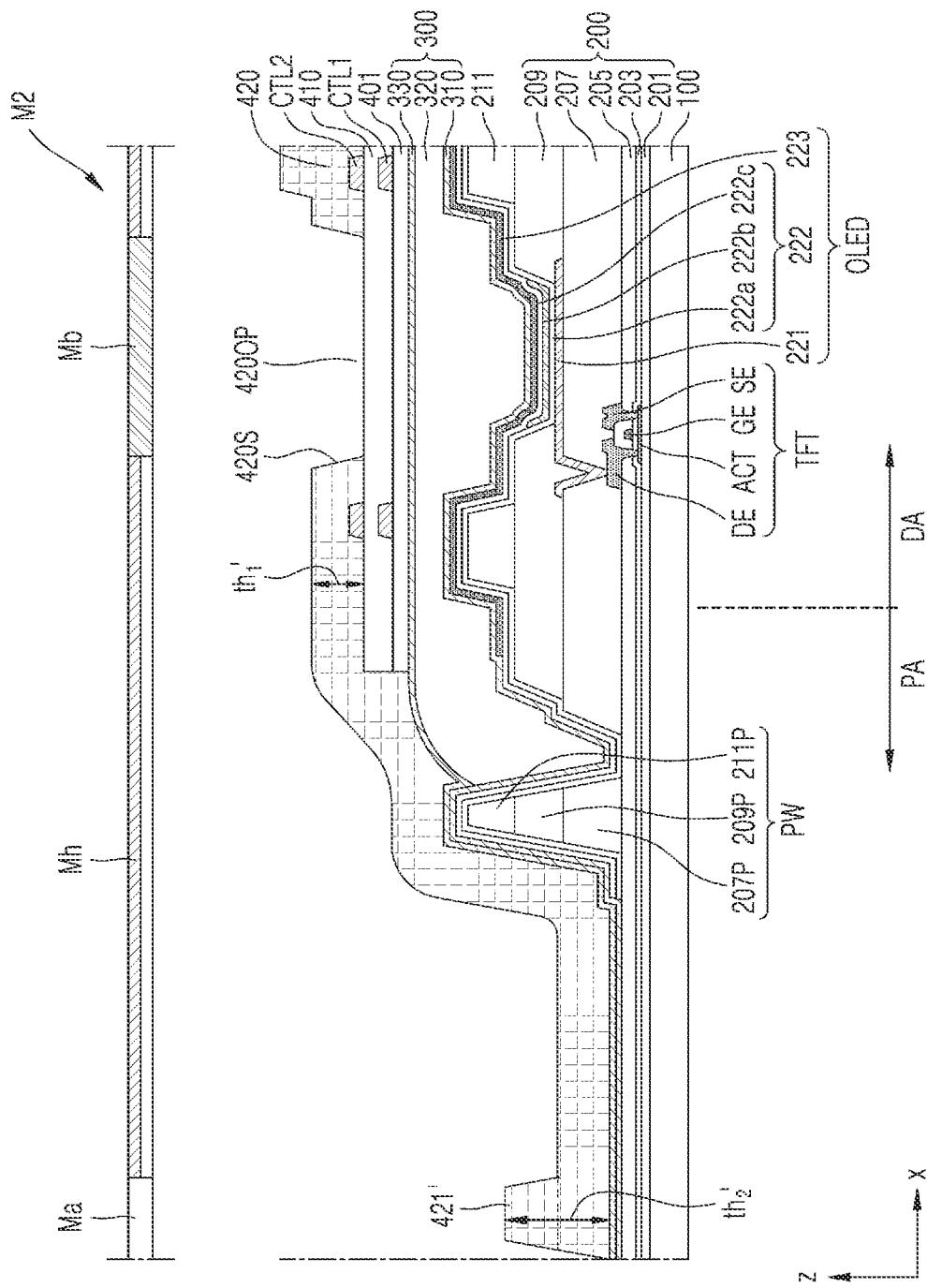
Figure 23:
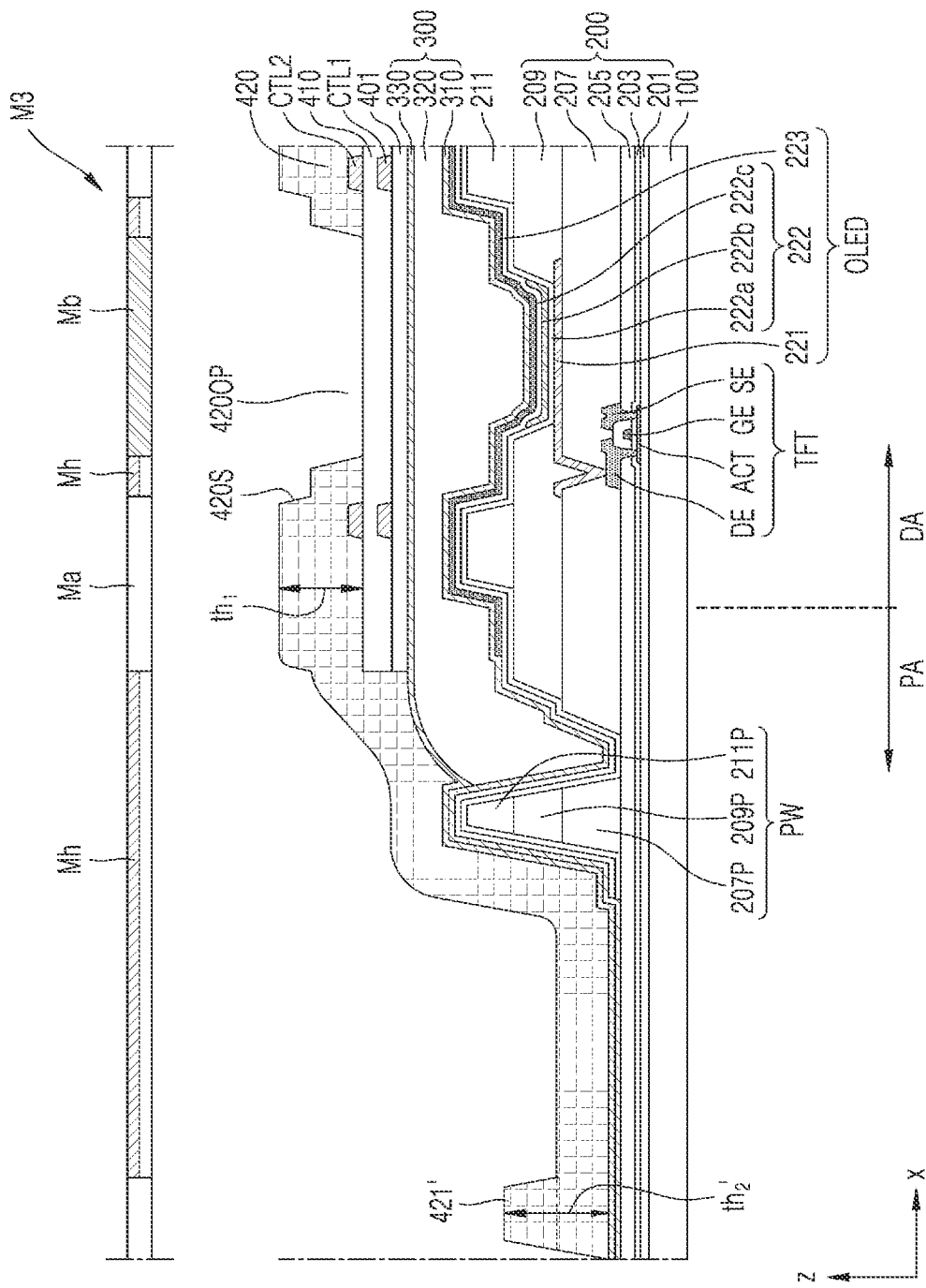

FIGS. 21, 22, and 23 are cross-sectional views illustrating a method of manufacturing the display apparatus 10, according to one or more embodiments. In FIGS. 21 to 23, the same reference numerals as those of FIG. 20 denote the same, and redundant descriptions thereof will be omitted.

Referring to FIGS. 21 to 23, the first insulating layer 420 of the display apparatus 10 may be manufactured by a halftone masking process.

A first mask M1 shown in FIG. 21, a second mask M2 shown in FIG. 22, and a third mask M3 shown in FIG. 23 may respectively include a first area Ma, a second area Mb, and a third area Mh having different light transmittances. The first area Ma may transmit light, the second area Mb may block light, and the third area Mh may partially transmit light. The locations of the first area Ma and the second area Mb may be changed according to the characteristics of materials forming the first insulating layer 420.

In the present embodiment, a material forming the first insulating layer 420 may be applied to a surface of the substrate 100, and exposing, developing, and curing the material applied on the substrate 100 using the first mask M1, the second mask M2, and the third mask M3.

Referring to FIG. 21, the first mask M1 may be a halftone mask used to form a step on the side surface 420S of the first insulating layer 420 that defines the first opening 420OP of the first insulating layer 420 in the display area DA of the display apparatus 10. The first mask M1 may include the second area Mb corresponding to a central portion of the first opening 420OP of the first insulating layer 420, the third area Mh corresponding to the side surfaces 420S, and the first area Ma corresponding to an area adjacent to a boundary between the display area DA and the peripheral area PA. In addition, the first mask M1 may include the third area Mh may correspond to an outer area of the peripheral area PA.

Accordingly, a staircase-shaped step may be formed on the side surfaces 420S of the first insulating layer 420 that define the first opening 420OP of the first insulating layer 420. In this case, a maximum thickness th1 of the first insulating layer 420 in the display area DA may be greater than a thickness th2 of the first insulating layer 420 in the peripheral area PA.

Referring to FIG. 22, the second mask M2 may be a halftone mask used to integrally form a protruding dam 421' with the first insulating layer 420 in the peripheral area PA of the display apparatus 10. That is, the protruding dam 421' may correspond to a portion of the first insulating layer 420 in the peripheral area PA. The second mask M2 may include the second area Mb corresponding to the central portion of the first opening 420OP of the first insulating layer 420, the first area Ma corresponding to the protruding dam 421' in the peripheral area PA, and the third area Mh corresponding to the remaining area.

Accordingly, the protruding dam 421' may be integrally formed with the first insulating layer 420 in the peripheral area PA. In this case, a maximum thickness th2' of the first insulating layer 420 in the peripheral area PA may be greater than a maximum thickness th1' of the first insulating layer 420 in the display area DA.

Referring to FIG. 23, the third mask M3 may be a halftone mask used to integrally form a protruding dam 421' with the first insulating layer 420 in the peripheral area PA of the display apparatus 10, and to form a step on the side surfaces 420S of the first insulating layer 420 defining the first opening 420OP of the first insulating layer 420 in the display area DA. The third mask M3 may include the second area Mb corresponding to the central portion of the first opening 420OP of the first insulating layer 420, the third area Mh corresponding to the side surfaces 420S, and the first area Ma corresponding to an area adjacent to a boundary between the display area DA and the peripheral area PA. In addition, the third mask M3 may include the first area Ma corresponding to the protruding dam 421', and the third area Mh corresponding to the remaining area of the peripheral area PA.

Accordingly, a staircase-shaped step may be formed on the side surfaces 420S defining the first opening 420OP of the first insulating layer 420 in the display area DA, and the protruding dam 421' may be integrally formed with the first insulating layer 420 in the peripheral area PA. In this case, a maximum thickness th2' of the first insulating layer 420 in the peripheral area PA may be substantially the same as a maximum thickness th1' of the first insulating layer 420 in the display area DA.

The display apparatus 10 according to one or more embodiments may include the first insulating layer 420 and the second insulating layer 430, wherein the first insulating layer 420 may be arranged on the encapsulation layer 300 and may include an opening, and the second insulating layer 430 may fill the opening. Thereby, light efficiency of the display apparatus 10 may be improved. In addition, a step is formed on the side walls that define an opening of the first insulating layer 420 facilitating filling of the second insulating layer 430 to significantly reduce unfilling defects of the second insulating layer 430, particularly when a width of the first opening 420OP is small.

Further, the display apparatus 10 according to one or more embodiments may include a protruding dam arranged on the first insulating layer 420 in the peripheral area PA, and thereby, the second insulating layer 430 may be formed to be flat in the display area DA.

It should be understood that the embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure including the following claims.

What is claimed is:

1. A display apparatus comprising:
   a substrate comprising a display area and a peripheral area outside the display area;
   a display element arranged on the substrate in the display area;
   an encapsulation layer arranged on the display element;
   a first insulating layer arranged on the encapsulation layer and comprising a first opening that corresponds to a light-emitting area of the display element; and
   a second insulating layer covering the first insulating layer,
   wherein a second refractive index of the second insulating layer is greater than a first refractive index of the first insulating layer, and
   wherein a side surface of the first insulating layer defining the first opening comprises a staircase-shaped step.

2. The display apparatus of claim 1, wherein the first opening of the first insulating layer overlaps the light-emitting area of the display element, and
   wherein the second insulating layer fills the first opening.

3. The display apparatus of claim 1, further comprising a conductive layer arranged below the first insulating layer and including sensing electrodes.

4. The display apparatus of claim 3, wherein the conductive layer comprises a first sub-conductive layer and a second sub-conductive layer, and
wherein a touch insulating layer is arranged between the first sub-conductive layer and the second sub-conductive layer.

5. The display apparatus of claim 1, wherein the display element comprises:
a pixel electrode;
a pixel defining layer covering an edge of the pixel electrode and comprising a second opening that exposes the pixel electrode;
an emission layer arranged in the second opening of the pixel defining layer; and
an opposite electrode covering the emission layer, and
wherein the first insulating layer at least partially overlaps the pixel defining layer.

6. The display apparatus of claim 5, wherein a first width of the first opening is greater than a second width of the second opening.

7. The display apparatus of claim 1, further comprising a first pixel and a second pixel emitting light of different colors,
wherein the first insulating layer comprises a first-first opening corresponding to the first pixel and a first-second opening corresponding to the second pixel,
wherein a first side surface of the first-first opening comprise a step, and a second side surface of the first-second opening does not comprise a step.

8. The display apparatus of claim 7, wherein a first light-emitting area of the first pixel is greater than a second light-emitting area of the second pixel.

9. The display apparatus of claim 1, wherein the first insulating layer extends to the peripheral area, and
wherein the display apparatus further comprises a protruding dam that protrudes from the first insulating layer in the peripheral area.

10. The display apparatus of claim 1, further comprising an anti-reflection layer comprising a color filter and a black matrix,
wherein the color filter overlaps the light-emitting area, and the black matrix overlaps a non-light-emitting area outside the light-emitting area.

11. A display apparatus comprising:
a substrate comprising a display area and a peripheral area outside the display area;
a display element arranged on the substrate in the display area;
an encapsulation layer arranged on the display element;
a first insulating layer arranged on the encapsulation layer and comprising a first opening that corresponds to a light-emitting area of the display element; and
a second insulating layer covering the first insulating layer,
wherein a second refractive index of the second insulating layer is greater than a first refractive index of the first insulating layer, and
wherein the display apparatus further comprises a protruding dam that protrudes from the first insulating layer in the peripheral area.

12. The display apparatus of claim 11, wherein the protruding dam is provided integrally with the first insulating layer.

13. The display apparatus of claim 11, further comprising a partition wall adjacent to the display area in the peripheral area,
wherein the encapsulation layer comprises a first inorganic encapsulation layer, an organic encapsulation layer, and a second inorganic encapsulation layer that are sequentially stacked, and
wherein the first inorganic encapsulation layer and the second inorganic encapsulation layer contact each other at one side of the partition wall.

14. The display apparatus of claim 11, further comprising an upper dam that is spaced apart from the protruding dam and arranged outside of the protruding dam,
wherein a valley portion provided by removing at least a portion of the first insulating layer is arranged between the protruding dam and the upper dam.

15. The display apparatus of claim 14, wherein a first thickness of the upper dam is substantially same as a second thickness of the protruding dam.

16. The display apparatus of claim 11, wherein the protruding dam is provided in plural, and wherein a plurality of protruding dams is spaced apart from each other.

17. The display apparatus of claim 11, wherein the protruding dam is arranged along an outer periphery of the display area.

18. The display apparatus of claim 11, wherein the protruding dam includes a plurality of openings or grooves.

19. The display apparatus of claim 11, further comprising:
a first valley portion between the display area and the protruding dam that is arranged in the peripheral area; and
a second valley portion between the protruding dam and an end of the substrate,
wherein a plurality of first holes penetrating through the first insulating layer is arranged in the first valley portion, and
wherein the second valley portion corresponds to an opening formed by removing the first insulating layer along a periphery of the display area.

20. The display apparatus of claim 11, wherein a side surface of the first insulating layer defining the first opening comprises a staircase-shaped step.

* * * * *